(12) United States Patent
Kuwahara et al.

(10) Patent No.: US 11,231,651 B2
(45) Date of Patent: Jan. 25, 2022

(54) PERIPHERAL PROCESSING APPARATUS AND PERIPHERAL PROCESSING METHOD

(71) Applicant: SCREEN HOLDINGS CO., LTD., Kyoto (JP)

(72) Inventors: Joji Kuwahara, Kyoto (JP); Mitsuya Kusuhara, Kyoto (JP)

(73) Assignee: SCREEN Holdings Co., Ltd.

( * ) Notice: Subject to any disclaimer, the term of this patent is extended or adjusted under 35 U.S.C. 154(b) by 145 days.

(21) Appl. No.: 15/952,281

(22) Filed: Apr. 13, 2018

(65) Prior Publication Data

US 2018/0299780 A1 Oct. 18, 2018

(30) Foreign Application Priority Data

Apr. 13, 2017 (JP) .............................. JP2017-079953

(51) Int. Cl.
*G03F 7/42* (2006.01)
*B08B 3/08* (2006.01)
*B08B 3/02* (2006.01)
*B08B 11/02* (2006.01)
*B08B 13/00* (2006.01)

(52) U.S. Cl.
CPC .............. *G03F 7/422* (2013.01); *B08B 3/02* (2013.01); *B08B 3/08* (2013.01); *B08B 11/02* (2013.01); *B08B 13/00* (2013.01)

(58) Field of Classification Search
None
See application file for complete search history.

(56) References Cited

U.S. PATENT DOCUMENTS

| 5,759,282 A | * | 6/1998 | Yang | ..................... C23C 14/225 |
| | | | | 118/723 E |
| RE38,113 E | | 5/2003 | Nishi | |
| RE38,223 E | | 5/2003 | Nishi | |
| (Continued) | | | | |

FOREIGN PATENT DOCUMENTS

| JP | 2001-102287 A | 4/2001 |
| JP | 2001-110712 A | 4/2001 |
| (Continued) | | |

OTHER PUBLICATIONS

Machine Generated English Translation of the claims of JP2014-22842A. Published Jul. 3, 2014 (Year: 2014).*

(Continued)

*Primary Examiner* — Sylvia MacArthur
(74) *Attorney, Agent, or Firm* — Ostrolenk Faber LLP

(57) ABSTRACT

Inclination identifying information for identifying inclination of a substrate with respect to a reference plane is detected. Based on the detected inclination identifying information and a first angle, a holding position of the substrate held by a rotation holder is corrected in a direction that is in parallel to the reference plane such that a distance between a portion of the substrate that is to be processed by a peripheral region processor and the center of the substrate is maintained constant. In this state, processing having directivity of inclination with respect to the reference plane by the first angle is performed on a peripheral region of the substrate by the peripheral region processor while the substrate is rotated by the rotation holder.

8 Claims, 15 Drawing Sheets

(56) References Cited

U.S. PATENT DOCUMENTS

| | | | |
|---|---|---|---|
| 8,043,467 B2* | 10/2011 | Nanba | H01L 21/31055 118/320 |
| 9,103,870 B2* | 8/2015 | Nakanishi | H02S 50/10 |
| 9,151,669 B2* | 10/2015 | Ito | G01N 21/956 |
| 9,404,874 B2* | 8/2016 | Nakanishi | G01N 21/6489 |
| 9,541,508 B2* | 1/2017 | Nakanishi | G01N 21/9505 |
| 9,728,443 B2* | 8/2017 | Yoshihara | H01L 21/6708 |
| 9,786,552 B2* | 10/2017 | Kim | H01L 21/76816 |
| 9,799,540 B2* | 10/2017 | Oono | H01L 21/67253 |
| 9,810,532 B2* | 11/2017 | Hashimoto | G01B 11/26 |
| 9,993,840 B2* | 6/2018 | Inagaki | B05D 1/02 |
| 10,115,588 B2* | 10/2018 | Hashimoto | H01L 21/02 |
| 2003/0198376 A1 | 10/2003 | Sadighi et al. | 382/153 |
| 2003/0202092 A1 | 10/2003 | Sadighi et al. | 348/87 |
| 2004/0031779 A1 | 2/2004 | Cahill et al. | 219/121.83 |
| 2007/0112465 A1 | 5/2007 | Sadighi et al. | 700/254 |
| 2007/0190437 A1* | 8/2007 | Kaneyama | G03F 7/70925 430/30 |
| 2007/0227444 A1 | 10/2007 | Nishide | 118/52 |
| 2010/0109202 A1 | 5/2010 | Choi et al. | 246/409 |
| 2010/0190663 A1* | 7/2010 | Li | B08B 11/02 506/33 |
| 2012/0105872 A1 | 5/2012 | Sai et al. | 356/630 |
| 2013/0334172 A1* | 12/2013 | Matsumoto | H01L 21/6708 216/85 |
| 2014/0178162 A1 | 6/2014 | Morikawa et al. | 414/416.08 |
| 2015/0147888 A1* | 5/2015 | Nonaka | H01L 21/6708 438/748 |
| 2015/0314314 A1* | 11/2015 | Kuwahara | B08B 3/02 427/8 |
| 2016/0089686 A1* | 3/2016 | Lee | B05D 1/002 216/92 |
| 2016/0096203 A1 | 4/2016 | Kai et al. | |
| 2016/0310979 A1* | 10/2016 | Inagaki | H01L 21/67259 |
| 2016/0358829 A1 | 12/2016 | Hayashi et al. | 438/16 |
| 2017/0017893 A1 | 6/2017 | Morikawa et al. | |
| 2018/0019112 A1 | 1/2018 | Kai et al. | |
| 2018/0231952 A1* | 8/2018 | Kuwahara | G05B 19/19 |
| 2018/0299780 A1* | 10/2018 | Kuwahara | B08B 3/08 |
| 2019/0049865 A1* | 2/2019 | Kuwahara | G03F 9/7042 |

FOREIGN PATENT DOCUMENTS

| | | | |
|---|---|---|---|
| JP | 2004-039730 A | | 2/2004 |
| JP | 2005093951 A | * | 4/2005 |
| JP | 2006-522476 A | | 9/2006 |
| JP | 2007-235089 A | | 9/2007 |
| JP | 2010-079147 A | | 4/2010 |
| JP | 5281350 B2 | | 9/2013 |
| JP | 2014122842 A | * | 7/2014 |
| KR | 10-2005-0051906 A | | 6/2005 |
| KR | 10-2010-0036154 A | | 4/2010 |
| KR | 10-2012-0052270 A | | 5/2012 |
| KR | 10-2014-0082926 A | | 7/2014 |
| KR | 10-2016-0039547 A | | 4/2016 |
| KR | 10-2016-0142778 | | 12/2016 |
| TW | 20073797 A | | 10/2007 |
| TW | 2008026684 A | | 1/2008 |

OTHER PUBLICATIONS

Machine Generated English Translation of the bibliographic data of JP2014-22842A. Published Jul. 3, 2014 (Year: 2014).*
Machine Generated English Translation of the description of JP2014-22842A. Published Jul. 3, 2014 (Year: 2014).*
Machine Generated English Translation of the claims of JP2005-93951. Published Apr. 7, 2005 (Year: 2005).*
Machine Generated English Translation of the description of JP2005-93951. Published Apr. 7, 2005 (Year: 2005).*
Machine Generated English Translation of the bibliographic data of JP2005-93951. Published Apr. 7, 2005 (Year: 2005).*
Office Action dated Sep. 27.2019 in counterpart Korean Patent Application No. 10-2018-0041542.
Decision to Grant dated Mar. 2, 2020 in counterpart Korean Patent Application No. 10-2018-0041542.
Notice of Reasons for Refusal dated Dec. 22, 2020 in counterpart Japanese Application No. 2017-079953.
Office Action dated Nov. 26, 2019 in corresponding Korean Patent Application No. 10-2018-0086589.
Decision to Grant a Patent dated Aug. 27, 2019 for Taiwanese Patent Application No. 107124622.
Office Action dated Oct. 16, 2018 in counterpart Taiwanese Patent Application No. 107110887.

* cited by examiner

F I G. 6
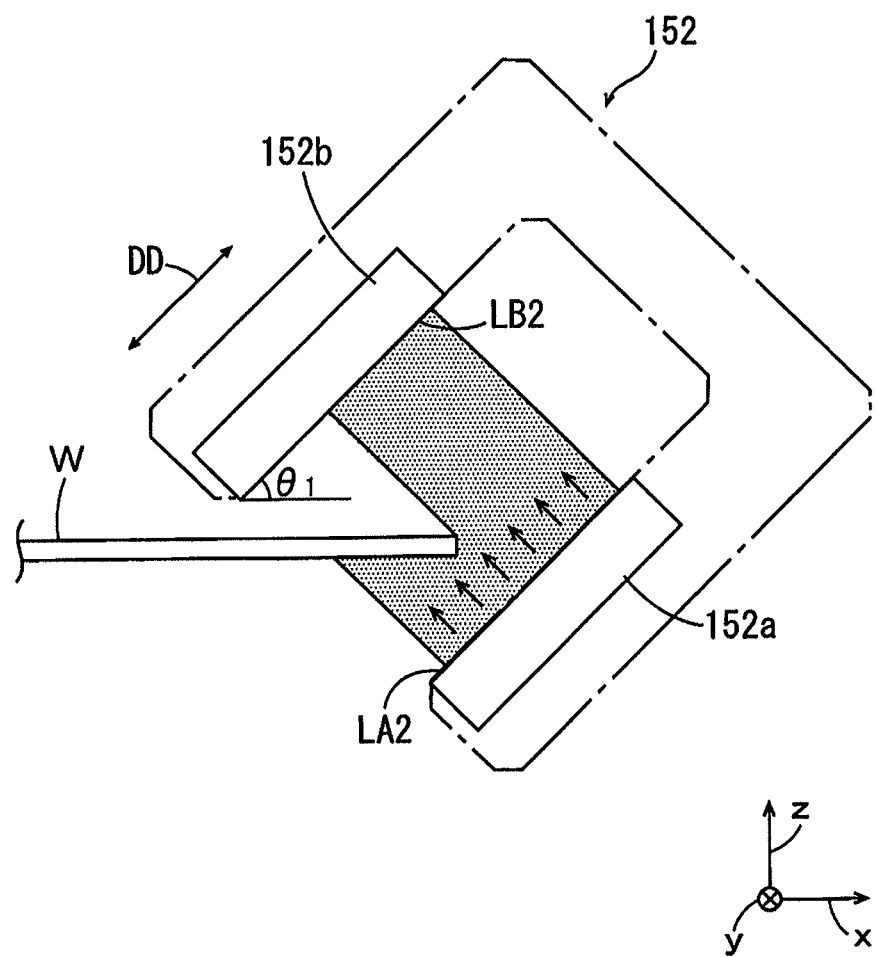

PERIPHERAL PROCESSING APPARATUS AND PERIPHERAL PROCESSING METHOD

BACKGROUND OF THE INVENTION

Field of the Invention

The present invention relates to a peripheral processing apparatus and a peripheral processing method of processing a peripheral region of one surface of a substrate.

Description of Related Art

In a substrate processing apparatus, a substrate supported horizontally by a spin chuck is rotated. In this state, a processing liquid is discharged to a substantially center portion of an obverse surface of the substrate from a nozzle, so that the processing liquid is supplied to the entire obverse surface of the substrate. Thereafter, predetermined thermal processing is performed, so that a thin film made of the processing liquid is formed on the obverse surface of the substrate. Here, in the case where the thin film is formed on a peripheral portion of the substrate, when a transport device that transports the substrate holds the peripheral portion of the substrate, the film is stripped and becomes particles. As such, after the processing liquid is supplied to the entire obverse surface of the substrate, processing of removing the processing liquid in the peripheral portion of the substrate is performed (JP 2001-110712 A, for example).

In a coating film removal apparatus described in JP 2001-110712 A, a position of a peripheral portion of a substrate held by a spin chuck is detected by a detection mechanism. In this state, a rotation phase of the spin chuck and the corresponding position of the peripheral portion of the substrate is acquired by rotation of the spin chuck by 360°. A rinse liquid is discharged from a rinse liquid discharge nozzle to the peripheral portion of the rotating substrate, whereby a resist liquid in the peripheral portion of the substrate is removed. When the rinse liquid is discharged, a position of the spin chuck is adjusted by an alignment mechanism such that a change of the position of the peripheral portion of the substrate caused by the rotation of the spin chuck is compensated. In this case, the spin chuck reciprocates in one direction and the opposite direction by an operation of the alignment mechanism, and the spin chuck is positioned while rotating the substrate.

BRIEF SUMMARY OF THE INVENTION

However, a complicated configuration and a complicated operation are required in order to position the spin chuck accurately such that the change of the position of the peripheral portion of the substrate is compensated. Further, it is actually difficult to position the spin chuck such that the spin chuck follows the change of the position of the peripheral portion of the substrate depending on a rotation speed of the substrate.

An object of the present invention is to provide a peripheral processing apparatus and a peripheral processing method of enabling accurate processing of a peripheral region of a substrate while inhibiting complication of a configuration and an operation.

(1) A peripheral processing apparatus according to one aspect of the present invention that performs processing on an annular peripheral region extending along an outer periphery of one surface of a substrate, the outer periphery being at least partially circular, includes a rotation holder that holds the substrate and rotates the substrate about a rotation axis that is in parallel to a first direction, a peripheral region processor that performs the processing that has directivity of inclination with respect to a reference plane orthogonal to the first direction by a first angle on a portion of the peripheral region of the held substrate, an information detector that detects information for identifying inclination of the held substrate with respect to the reference plane as inclination identifying information, and a position corrector that corrects a holding position of the substrate held by the rotation holder in a direction that is in parallel to the reference plane based on the inclination identifying information detected by the information detector and the first angle such that a distance between a portion of the substrate that is to be processed by the peripheral region processor and a center of the substrate is maintained constant when the substrate is rotated by the rotation holder.

In this peripheral processing apparatus, the inclination identifying information for identifying the inclination of the substrate with respect to the reference plane is detected. Further, based on the detected inclination identifying information and the first angle, the holding position of the substrate held by the rotation holder is corrected in a direction that is in parallel to the reference plane such that a distance between a portion of the substrate that is to be processed by the peripheral region processor and the center of the substrate is maintained constant. In this state, the processing having directivity of inclination with respect to the reference plane by the first angle is performed on the peripheral region of the substrate by the peripheral region processor while the substrate is rotated by the rotation holder. In this case, the processing can be performed on a portion located at a position spaced apart from the center of the substrate by a constant distance in the entire circumference of the substrate while the substrate is maintained inclined. Therefore, it is possible to appropriately perform the processing on the peripheral region of the substrate while inhibiting complication of the configuration and operation of the apparatus.

(2) The information detector may detect positions of a plurality of detection portions of the held substrate in the first direction as the inclination identifying information. In this case, the inclination identifying information can be detected with a simple configuration.

(3) The information detector may include a first detector that detects positions of the plurality of detection portions in a second direction that is inclined with respect to the first direction, a second detector that detects positions of the plurality of detection portions in a third direction that is in parallel to the reference plane, and a calculator that calculates the positions of the plurality of detection portions in the first direction based on the positions, of the plurality of detection portions in the second and third directions, that are detected by the first and second detectors. In this case, it is possible to acquire the positions of the plurality of detection portions in the first direction while inhibiting complication of the configuration and operation of the apparatus.

(4) The first and second detectors may respectively include line sensors. In this case, it is possible to acquire positions of the plurality of detection portions in the first direction while inhibiting an increase in cost of the apparatus while using general-purpose line sensors.

(5) The peripheral processing apparatus may further include a holder that integrally holds the first and second detectors, wherein the positions of the plurality of detection portions may be sequentially detected by the first and second detectors when the substrate is rotated by the rotation holder.

In this case, positions of the plurality of detection portions in the second and third directions can be detected by the integrally held first and second detectors. Thus, complication of the configuration of the apparatus is inhibited.

(6) The position corrector may include a movement mechanism that moves the substrate with respect to the rotation holder, and a movement controller that controls the movement mechanism based on the detected inclination identifying information and the first angle. In this case, the holding position of the substrate held by the rotation holder can be corrected easily.

(7) The movement mechanism may be configured to move the substrate in a fourth direction that is in parallel to the reference plane, and the movement controller may control the rotation holder based on the detected inclination identifying information and the first angle such that a correction direction of the holding position coincides with the fourth direction by rotation of the substrate, and may control the movement mechanism such that the substrate moves in the fourth direction after rotation of the substrate. In this case, because the movement direction of the substrate is limited to the fourth direction, compared to the case where the substrate is moved in a plurality of directions, the configuration of the movement mechanism is simplified, and the cost of the apparatus is lowered.

(8) The peripheral region processor may include a nozzle that discharges a processing liquid in a direction that is inclined with respect to the reference plane by the first angle. In this case, the processing having directivity is processing of discharging the processing liquid in a direction inclined with respect to the reference plane by the first angle. In this configuration, the processing liquid can be supplied to a portion that is spaced apart from the center of the substrate by the constant distance in the entire circumference of the substrate. Therefore, the processing can be performed on the peripheral region of the substrate appropriately.

(9) According to another aspect of the present invention, a peripheral processing method of performing processing on an annular peripheral region extending along an outer periphery of one surface of a substrate, the outer periphery being at least partially circular, includes holding the substrate by a rotation holder, detecting information for identifying inclination of the held substrate with respect to a reference plane that is orthogonal to a first direction as inclination identifying information, correcting a holding position of the substrate held by the rotation holder in a direction that is in parallel to the reference plane, and performing processing having directivity of inclination with respect to the reference plane by the first angle using a peripheral region processor on a portion of a peripheral region of the held substrate while rotating the substrate about a rotation axis that is in parallel to the first direction using the rotation holder, wherein the correcting includes correcting the holding position based on the detected inclination identifying information and the first angle such that a distance between a portion of the substrate that is to be processed by the peripheral region processor and a center of the substrate is maintained constant when the substrate is rotated by the rotation holder.

With use of this peripheral processing method, the inclination identifying information for identifying the inclination of the substrate with respect to the reference plane is detected. Further, based on the detected inclination identifying information and the first angle, the holding position of the substrate held by the rotation holder is corrected in a direction that is in parallel to the reference plane such that a distance between a portion of the substrate that is to be processed by the peripheral region processor and the center of the substrate is maintained constant. In this state, the processing having the directivity of inclination with respect to the reference plane by the first angle is performed on the peripheral region of the substrate by the peripheral region processor while the substrate is rotated by the rotation holder. In this case, the processing can be performed on a portion located at a position spaced apart from the center of the substrate by the constant distance in the entire circumference of the substrate while the substrate is maintained inclined. Therefore, it is possible to appropriately perform the processing on the peripheral region of the substrate while inhibiting complication of the configuration and operation of the apparatus.

(10) The detecting information may include detecting positions of a plurality of detection portions of the held substrate in the first direction as the inclination identifying information.

(11) The detecting information may include detecting positions of the plurality of detection portions in a second direction that is inclined with respect to the first direction using a first detector, detecting positions of the plurality of detection portions in a third direction that is in parallel to the reference plane using a second detector, and calculating positions of the plurality of detection portions in the first direction based on the detected positions of the plurality of detection portions in the second and third directions.

(12) The first and second detectors may respectively include line sensors.

(13) The first and second detectors may be integrally held, and the detecting positions of the plurality of detection portions using the first detector and the detecting positions of the plurality of detection portions using the second detector may include sequentially detecting the positions of the plurality of detection portions using the first and second detectors by rotation of the substrate by the rotation holder.

(14) The correcting holding position may include moving the substrate with respect to the rotation holder by a movement mechanism based on the detected inclination identifying information and the first angle.

(15) The movement mechanism may be configured to move the substrate in a fourth direction in parallel to the reference plane, and the moving substrate by the movement mechanism may include controlling the rotation holder based on the detected inclination identifying information and the first angle such that a correction direction of the holding position coincides with the fourth direction by rotation of the substrate, and controlling the movement mechanism such that the substrate moves in the fourth direction after the substrate is rotated.

(16) The performing processing having directivity may include discharging a processing liquid in a direction that is inclined with respect to the reference plane by the first angle using a nozzle.

Other features, elements, characteristics, and advantages of the present invention will become more apparent from the following description of preferred embodiments of the present invention with reference to the attached drawings.

BRIEF DESCRIPTION OF THE SEVERAL
VIEWS OF THE DRAWING

FIG. 6 is a diagram for explaining detection of the outer peripheral end of the substrate by an inclination detector;

DESCRIPTION OF THE PREFERRED EMBODIMENTS

A peripheral processing apparatus and a peripheral processing method according to one embodiment of the present invention will be described below with reference to the drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a substrate for a solar cell or the like. The substrate that is used in the present embodiment has an at least partially circular outer periphery. For example, the outer periphery except for a notch for positioning is circular.

Further, in the following description, an obverse surface of the substrate refers to a surface (main surface) on which various types of films such as a photosensitive film, an anti-reflection film and a protection film are formed, and a back surface of the substrate refers to the other surface of the substrate on the opposite side. A peripheral region of the substrate refers to an annular region between a circular outer periphery of the substrate, and a circle that is located apart inwardly from the outer periphery by a predetermined distance.

Further, in the following description, peripheral processing of the substrate means any processing performed on the peripheral region of the substrate. The peripheral processing includes peripheral region removal processing and edge exposure processing, for example. The peripheral region removal processing is processing of removing a film portion on the peripheral region of the film formed on the obverse surface of the substrate. The edge exposure processing is processing of exposing a photosensitive film portion on the peripheral region of the photosensitive film formed on the obverse surface of the substrate.

[1] Basic Configuration of Peripheral Processing Apparatus

Figure 1:
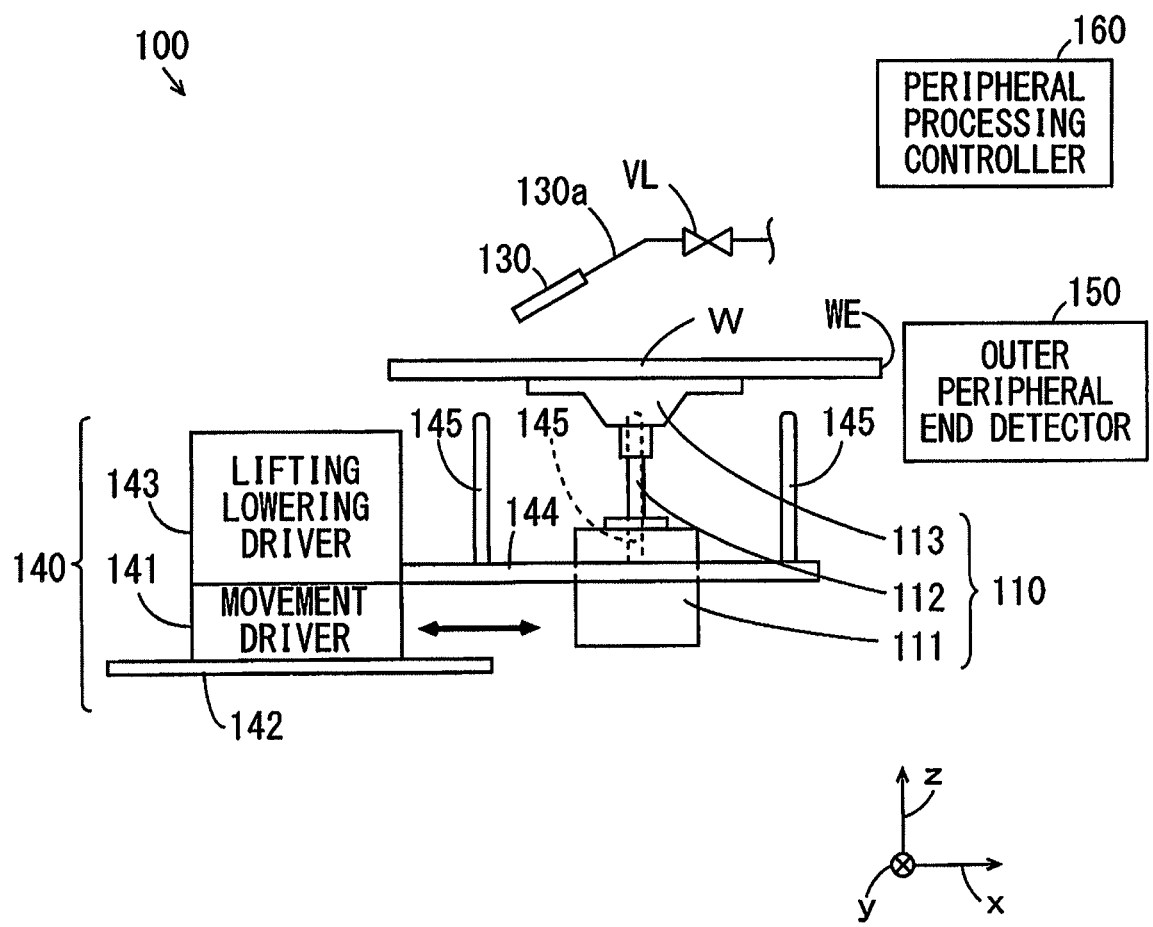
FIG. 1 is a schematic side view showing a basic configuration of a peripheral processing apparatus according to a first embodiment.

FIG. 1 is a schematic side view showing the basic configuration of the peripheral processing apparatus according to a first embodiment. A film is formed on an obverse surface (upper surface) of the substrate W that is carried into the peripheral processing apparatus 100 of FIG. 1. In the peripheral processing apparatus 100 of FIG. 1, the above mentioned peripheral region removal processing is performed as the peripheral processing.

In this peripheral processing apparatus 100, an X axis, a Y axis and a Z axis that are orthogonal to one another are defined. The X axis and the Y axis are orthogonal to each other in a horizontal plane, and the Z axis is perpendicular to the horizontal plane. Hereinafter, the direction that is in parallel to the X axis is referred to as an X direction, the direction that is in parallel to the Y axis is referred to as a Y direction, and the direction that is in parallel to the Z axis is referred to as a Z direction. FIG. 1 and subsequent FIGS. 3 to 7 and FIGS. 9 to 15 are accompanied by arrows x, y, z indicating the X direction, the Y direction and the Z direction. The direction of the arrow x and its opposite direction are collectively termed as the X direction, and the direction of the arrow y and its opposite direction are collectively termed as the Y direction, and the direction of z and its opposite direction are collectively termed as the Z direction.

The peripheral processing apparatus 100 includes a substrate rotation mechanism 110, a removal nozzle 130, a substrate movement mechanism 140, an outer peripheral end detector 150 and a peripheral processing controller 160. The substrate rotation mechanism 110 includes a rotation driver 111, a rotation shaft 112 and a substrate holder 113. The rotation driver 111 is an electric motor, for example. The rotation shaft 112 is connected to the rotation driver 111 to extend in the Z direction. The Z direction is an example of a first direction. The substrate holder 113 is connected to an upper end of the rotation shaft 112.

The substrate holder 113 is configured to be switchable between a suction state where the substrate holder 113 holds the substrate W placed on the substrate holder 113 by suction and a support state where the substrate holder 113 holds the substrate W placed on the substrate holder 113 without suction. The rotation shaft 112 and the substrate holder 113 are integrally rotated by the rotation driver 111. Thus, the substrate W held by the substrate holder 113 is rotated. In the present example, an angle of the rotation shaft 112 in a certain state is defined as a reference angle (0°). In the following description, a rotation angle of the rotation shaft 112 means the rotation angle with respect to the reference angle.

The removal nozzle 130 is provided above the substrate W that is held by the substrate holder 113 by suction. A supply pipe 130a extending from a removal liquid supply source (not shown) is connected to the removal nozzle 130. A valve VL is provided at the supply pipe 130a. The removal nozzle 130 performs processing having directivity of inclination with respect to the horizontal plane by a predetermined angle on the peripheral region of the substrate W. Specifically, when the valve VL is opened, a removal liquid is supplied to the removal nozzle 130 through the supply pipe 130a. Thus, the removal liquid is discharged in a direction that is inclined with respect to the horizontal plane by a predetermined angle from the removal nozzle 130. Thus, the removal liquid is supplied to the peripheral region of the substrate W rotated by the substrate rotation mechanism 110. Thus, the film portion on the peripheral region of the substrate W is removed.

The substrate movement mechanism 140 includes a movement driver 141, a linear guide 142, a lifting lowering driver 143, a coupling member 144 and a plurality (three in the present example) of support pins 145. The movement driver 141 is provided on the linear guide 142. The linear guide 142 is provided to extend in the X direction on a surface on which the peripheral processing apparatus 100 is placed. The movement driver 141 includes a pulse motor, for example, and is configured to be movable in the X direction on the linear guide 142.

The lifting lowering driver 143 is provided on the movement driver 141 and moves integrally with the movement driver 141 in the X direction. The coupling member 144 is connected to the lifting lowering driver 143 to extend in the horizontal direction below the substrate W held by the substrate holder 113. The plurality of support pins 145 extend upwardly from the coupling member 144 around the rotation shaft 112. The lifting lowering driver 143 is constituted by an air cylinder, for example, and supports the coupling member 144 movably up and down in the Z direction. Thus, the plurality of support pins 145 are lifted and lowered between upper positions and lower positions. When the plurality of support pins 145 are located at the upper positions, the upper ends of the plurality of support pins 145 are located at positions farther upward than the substrate holder 113. When the plurality of support pins 145 are located at the lower positions, the upper ends of the plurality of support pins 145 are located at positions farther downward than the substrate holder 113. In the case where the substrate holder 113 is in the support state, the plurality of support pins 145 are lifted to the upper positions, so that the substrate W is supported by the plurality of support pins 145. In this state, the movement driver 141 moves in the X direction, so that the lifting lowering driver 143, the coupling member 144 and the plurality of support pins 145 move in the X direction. Thus, the substrate W supported by the plurality of support pins 145 move in the X direction.

The outer peripheral end detector 150 detects a position of an outer peripheral end of the substrate W. Details of the outer peripheral end detector 150 will be described below. The peripheral processing controller 160 includes a CPU (Central Processing Unit), a ROM (Read Only Memory), a RAM (Random Access Memory), a storage device and so on. The peripheral processing controller 160 switches the substrate holder 113 between the suction state and the support state, controls the rotation driver 111 to control the rotation of the substrate W and controls the valve VL to control the discharging of the removal liquid by the removal nozzle 130. Further, the peripheral processing controller 160 controls the movement driver 141 and the lifting lowering driver 143 to control the movement of the substrate W in the X direction, and the lifting and lowering of the substrate W. Further, the peripheral processing controller 160 detects the information for identifying the inclination of the substrate W with respect to the reference plane as inclination identifying information based on the result of detection by the peripheral end detector 150. In the present example, the reference plane is the horizontal plane.

[2] Reason for Degradation of Accuracy of Peripheral Processing

In the peripheral processing of the substrate W, it is predetermined that the width in a radial direction of the peripheral region of the substrate W to be processed is constant. However, the width in the radial direction of the peripheral region of the substrate W that is actually processed is sometimes not uniform in a circumferential direction of the substrate W due to the following reasons.

Figure 2A:
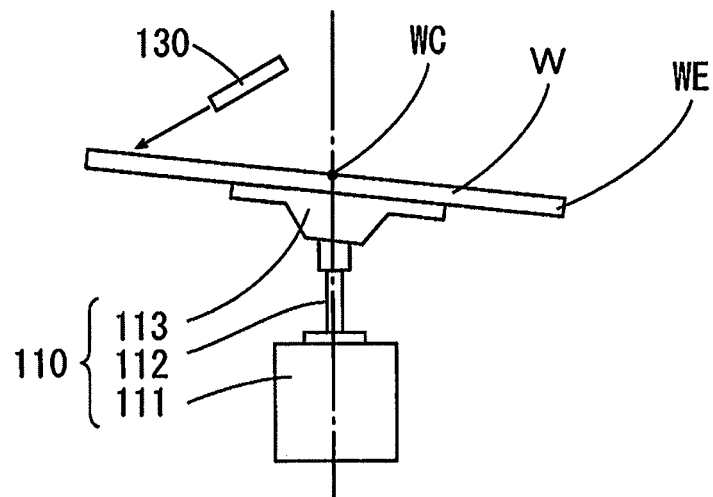
FIGS. 2A to 2C are diagrams showing one example of a reason why accuracy of peripheral region removal processing is degraded.
Figure 2B:
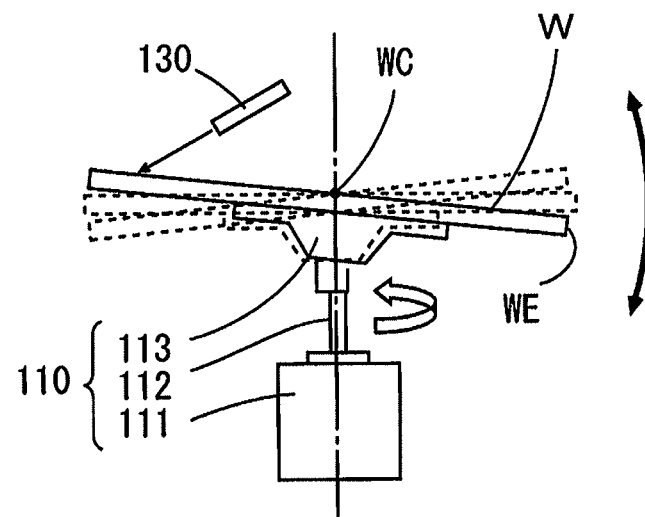
Figure 2C:
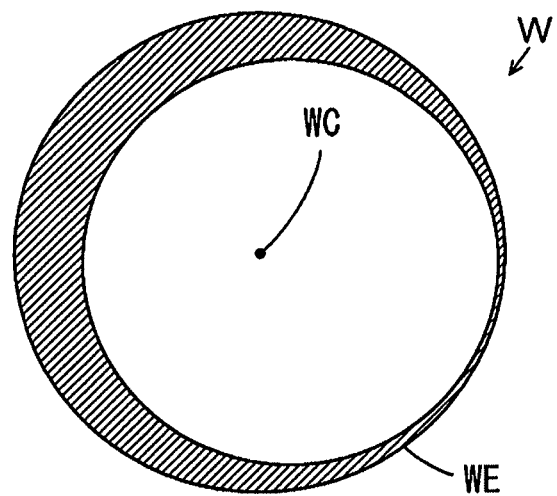

FIGS. 2A to 2C are diagrams showing one example of the reasons for the degradation of accuracy of the peripheral region removal processing. As shown in FIG. 2A, the substrate holder 113 may be attached inclinedly with respect to the rotation shaft 112 depending on dimension accuracy and assembly accuracy of each constituent component of the substrate rotation mechanism 110. In this case, the substrate W held by the substrate holder 113 by suction is inclined with respect to the plane (horizontal plane) orthogonal to the axial center of the rotation shaft 112.

As shown in FIG. 2B, when the substrate W is rotated in this state, the outer peripheral end WE of the substrate W vibrates up and down. In this case, a traveling direction of the removal liquid discharged from the removal nozzle 130 is different from a vibration direction of the peripheral region of the substrate W. Therefore, the distance between a position on the obverse surface of the substrate W at which the removal liquid arrives and the outer peripheral end WE of the substrate W changes depending on the rotation angle of the rotation shaft 112.

As shown in FIG. 2B, the removal nozzle 130 discharges the removal liquid obliquely downwardly towards the peripheral region of the substrate W. The removal liquid that has arrived on the substrate W is led outwardly by a centrifugal force caused by the rotation of the substrate W, so that the region between the arrival position of the removal liquid and the outer peripheral end WE of the substrate W is processed by the removal liquid. In this case, the closer the peripheral region of the substrate W is to the removal nozzle 130, the larger the distance between the arrival position of the removal liquid and the outer peripheral end WE of the substrate W is. Thus, the region larger than the region to be essentially processed in the radial direction of the substrate W is processed by the removal liquid. On the other hand, the farther the peripheral region of the substrate W is from the removal nozzle 130, the smaller the distance between the arrival position of the removal liquid and the outer peripheral end WE of the substrate W is. Thus, the region smaller than the region to be essentially processed in the radial direction of the substrate W is processed by the removal liquid. As a result, as indicated by the hatching in FIG. 2C, the peripheral region of the substrate W to be processed is decentered from the center WC of the substrate W.

The case where the substrate holder 113 is attached inclinedly with respect to the axial center of the rotation shaft 112 is described in the above mentioned example. However, when the rotation shaft 112 is curved, the processing accuracy is also degraded due to the same reason as the above mentioned example.

In the present embodiment, the inclination identifying information for identifying the inclination of the substrate W with respect to the horizontal plane is detected based on the result of detection by the outer peripheral end detector 150 of FIG. 1. The position of the substrate W is corrected with the substrate W maintained inclined based on the detected inclination identifying information, such that the distance between the arrival position of the removal liquid and the center WC of the substrate W is uniform in the circumferential direction of the substrate W.

In the following description, a state where the center WC of the substrate W coincides with the axial center of the rotation shaft 112 and the substrate W is not inclined with respect to the horizontal plane (a state where the surface of the substrate W is orthogonal to the axial center of the rotation shaft 112) is referred to as a reference state. Further, in the case where it is assumed that the substrate W is in the reference state, a position on the substrate W at which the removal liquid arrives from the removal nozzle 130 is referred to as a reference arrival position. A position on the substrate W at which the removal liquid arrives in the actual state of the substrate W at a current time point is referred to as an actual arrival position. In the circumferential direction of the substrate W, the distance between the reference arrival position and the center WC of the substrate W is uniform.

[3] Outer Peripheral End Detector

Figure 3:
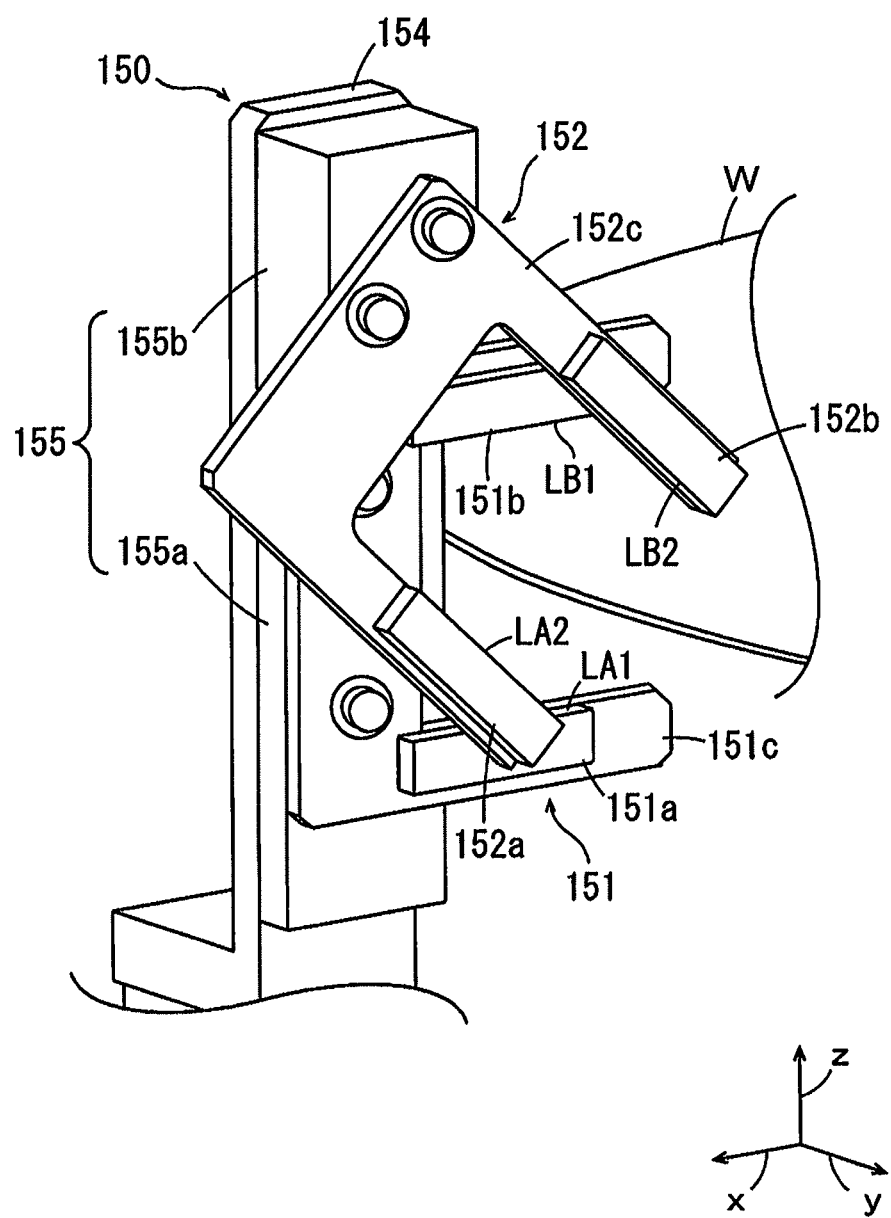
FIG. 3 is an external perspective view showing an example of a configuration of an outer peripheral end detector.

FIG. 3 is an external perspective view showing an example of a configuration of the outer peripheral end detector 150 of FIG. 1. As shown in FIG. 3, the outer peripheral end detector 150 includes a vertical detector 151, an inclination detector 152 and support members 154, 155.

The support member 154 is provided in a plate shape to extend in the Z direction. The support member 155 is fixed to one surface of the support member 154. The support member 155 includes fixing portions 155a, 155b arranged vertically and have different thicknesses. The thickness of the fixing portion 155b is larger than the thickness of the fixing portion 155a. The vertical detector 151 is fixed on the fixing portion 155a of the support member 155, and the inclination detector 152 is fixed on the fixing portion 155b of the support member 155.

The vertical detector 151 includes an emitter 151a, a light receiver 151b and a holder 151c. The holder 151c holds the emitter 151a and the light receiver 151b such that the light receiver 151b is located above the emitter 151a. The emitter 151a has an emission surface LA1 that is in parallel to the X direction, and the light receiver 151b has a light receiving surface LB1 that is in parallel to the X direction. In the present example, the light receiver 151b is a line sensor, and a plurality of pixels are arranged in one row extending in the X direction on the light receiving surface LB1. The emission surface LA1 of the emitter 151a and the light receiving surface LB1 of the light receiver 151b face each other in the Z direction. The peripheral region of the substrate W held by the substrate holder 113 (FIG. 1) is located between the emission surface LA1 of the emitter 151a and the light receiving surface LB1 of the light receiver 151b.

The inclination detector 152 includes an emitter 152a, a light receiver 152b and a holder 152c. The holder 152c holds the emitter 152a and the light receiver 152b such that the light receiver 152b is located at a position farther inward and obliquely farther upward than the emitter 152a. The emitter 152a has an emission surface LA2 that is inclined with respect to the X direction, and the light receiver 152b has a light receiving surface LB2 that is inclined with respect to the X direction. In the present example, the light receiver 152b is a line sensor, and a plurality of pixels are arranged in one row on the light receiving surface LB2. The emission surface LA2 of the emitter 152a and the light receiving surface LB2 of the light receiver 152b face each other in a direction that is inclined with respect to the Z direction. The peripheral region of the substrate W held by the substrate holder 113 (FIG. 1) is located between the emission surface LA2 of the emitter 152a and the light receiving surface LB2 of the light receiver 152b.

The peripheral processing controller 160 of FIG. 1 controls the emission of light by the emitters 151a, 152b. Results of detection by the light receivers 151b, 152b are supplied to the peripheral processing controller 160.

In the present example, because general-purpose line sensors can be used as the light receiver 151b of the vertical detector 151 and the light receiver 152b of the inclination detector 152, an increase in cost of the apparatus can be inhibited. On the other hand, it is difficult to detect the position of the outer peripheral end of the substrate W in the Z direction using one line sensor. As such, it is possible to detect the position of the outer peripheral end of the substrate W in the Z direction, as described below, by using a combination of the vertical detector 151 and the inclination detector 152.

Figure 4:
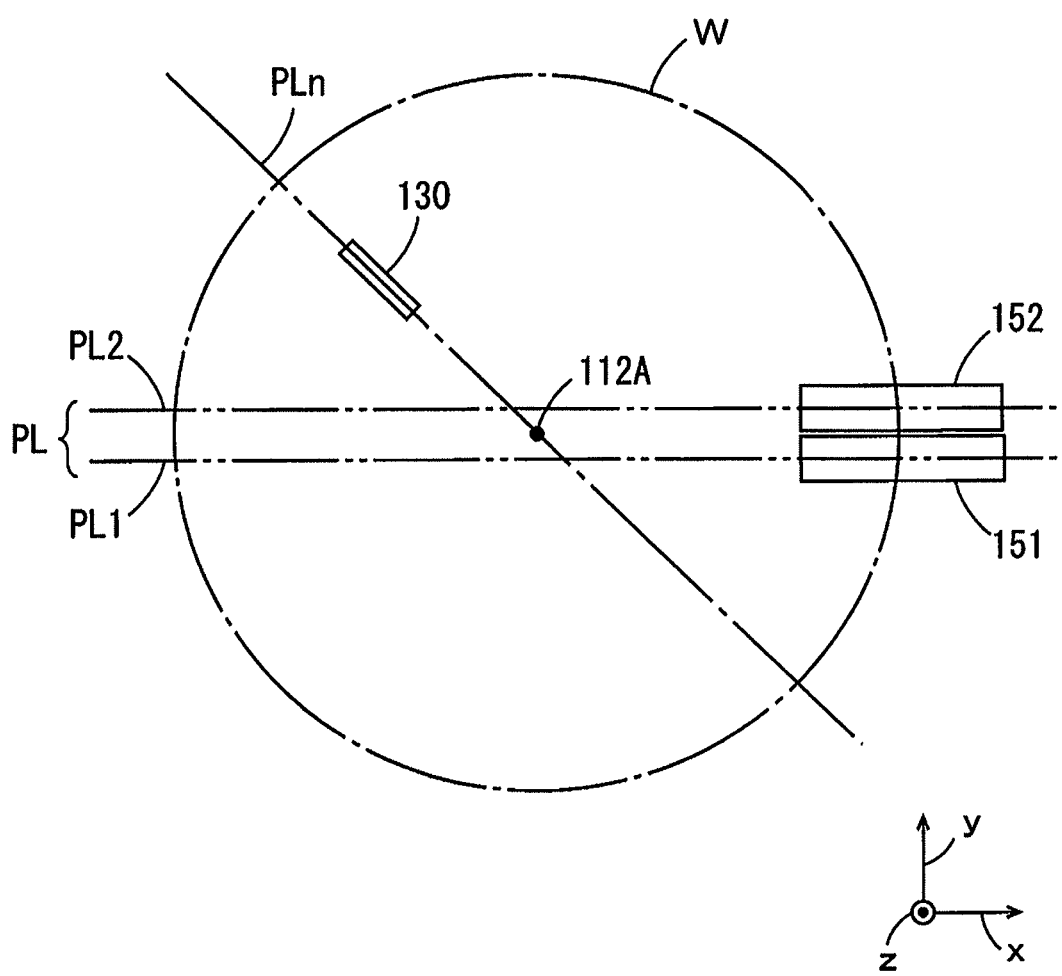
FIG. 4 is a schematic plan view for explaining a positional relationship among a vertical detector, an inclination detector, a removal nozzle and a rotation shaft.

FIG. 4 is a schematic plan view for explaining a positional relationship among the vertical detector 151, the inclination detector 152, the removal nozzle 130 of FIG. 1 and the rotation shaft 112 of FIG. 1. In FIG. 4, the substrate W in the reference state is indicated by a one-dot and dash line. As shown in FIG. 4, the vertical detector 151 is arranged in a virtual plane PL1 in parallel to the X direction and the Z direction, and the inclination detector 152 is arranged in a virtual plane PL2 that is in parallel to the vertical plane PL1 and in close proximity to the virtual plane PL1. The axial center 112A of the rotation shaft 112 of FIG. 1 is located between the virtual plane PL1 and the virtual plane PL2, or a position that coincides with one of the virtual plane PL1 and the virtual plane PL2.

Actually, the distance between the virtual plane PL1 and the virtual plane PL2 of FIG. 4 is significantly smaller than the size of the substrate W. Therefore, in the present example, the virtual plane PL1 and the virtual plane PL2 are considered to be the same plane (hereinafter referred to as a detection plane PL). Further, it is considered that the axial center 112A of the rotation shaft 112 is located in the detection plane PL.

The plurality of pixels of the light receiver 151b (FIG. 3) of the vertical detector 151 are arranged in one row in the X direction in the detection plane PL, and the plurality of pixels of the light receiver 152b (FIG. 3) of the inclination detector 152 are arranged in one row in a direction that is inclined with respect to the X direction in the detection plane PL.

The removal nozzle 130 is arranged in a nozzle plane PLn that is in parallel to the Z direction and passes through the axial center 112A of the rotation shaft 112. In the present example, the nozzle plane PLn intersects with the detection plane PL. The nozzle plane PLn may coincide with the detection plane PL. The removal liquid discharged from the removal nozzle 130 travels along the nozzle plane PLn and arrives in the peripheral region of the substrate W.

Figure 5:
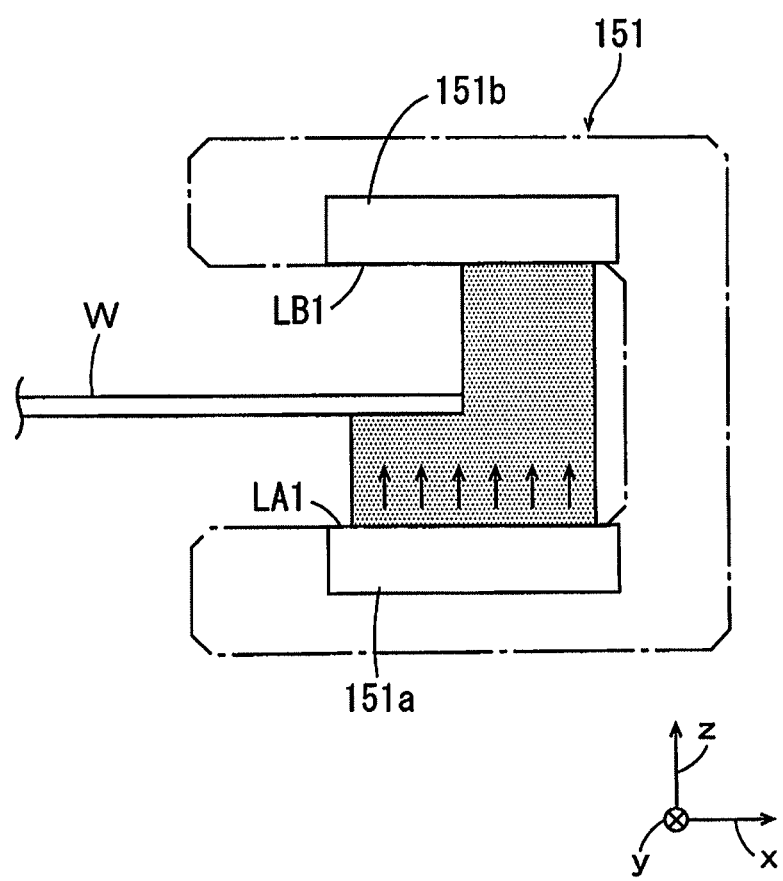
FIG. 5 is a diagram for explaining detection of an outer peripheral end of a substrate by the vertical detector.

FIG. 5 is a diagram for explaining the detection of the outer peripheral end of the substrate W by the vertical detector 151. As shown in FIG. 5, strip-shape light is emitted in the vertically upward direction (Z direction) from the emission surface LA1 of the emitter 151a towards the light receiving surface LB1 of the light receiver 151b. The emitted light travels along the detection plane PL of FIG. 4, part of the emitted light is shielded by the peripheral region of the substrate W, and the other part of the emitted light is incident on parts of the pixels on the light receiving surface LB1. A position of the outer peripheral end of the substrate W in the X direction in the detection plane PL is detected based on the positions of the pixels, that have received the light from the light emitter 151a, out of the plurality of pixels of the light receiver 151b.

FIG. 6 is a diagram for explaining the detection of the outer peripheral end of the substrate W by the inclination detector 152. Hereinafter, a direction in which the plurality of pixels of the light receiver 152b are arranged is referred to as an inclination detection direction DD. Further, an angle that is formed by the inclination detection direction DD with respect to the X direction is referred to as inclination detection angle $\theta_1$. As shown in FIG. 6, strip-shape light is emitted obliquely upwardly from the emission surface LA2 of the emitter 152a towards the light receiving surface LB2 of the light receiver 152b. The emitted light travels along the detection plane PL of FIG. 4, part of the emitted light is shielded by the peripheral region of the substrate W, and the other part of the emitted light is incident on parts of the pixels on the light receiving surface LB2. A position of the outer peripheral end of the substrate W in the inclination detection direction DD in the detection plane PL is detected based on the positions of the pixels, that have received the light from the emitter 152a, out of the plurality of pixels of the light receiver 152b.

In the present example, the reference position information indicating a position of the outer peripheral end of the substrate W in the case where the substrate W is in the reference state is stored in advance by the peripheral processing controller 160 of FIG. 1. An X deviation amount in the detection plane PL is acquired based on the result of detection by the vertical detector 151 and the reference position information, and an inclination deviation amount in the detection plane PL is detected based on the result of detection by the inclination detector 152 and the reference position information. The X deviation amount means an amount of position deviation between the outer peripheral end of the actual substrate W and the outer peripheral end of the substrate W in the reference state in the X direction, and the inclination deviation amount means an amount of position deviation between the outer peripheral end of the actual substrate W and the outer peripheral end of the substrate W in the reference state in the inclination detection direction DD.

[4] Arrival Deviation Amount

In the present embodiment, before the above mentioned peripheral region removal processing is performed, positions in the outer peripheral end of the substrate W are sequentially detected on the detection plane PL while the substrate W is rotated, and the distances between the actual arrival positions and the reference arrival position on the detection plane PL (hereinafter referred to as arrival deviation amounts) are sequentially calculated based on the results of detection.

Figure 7:
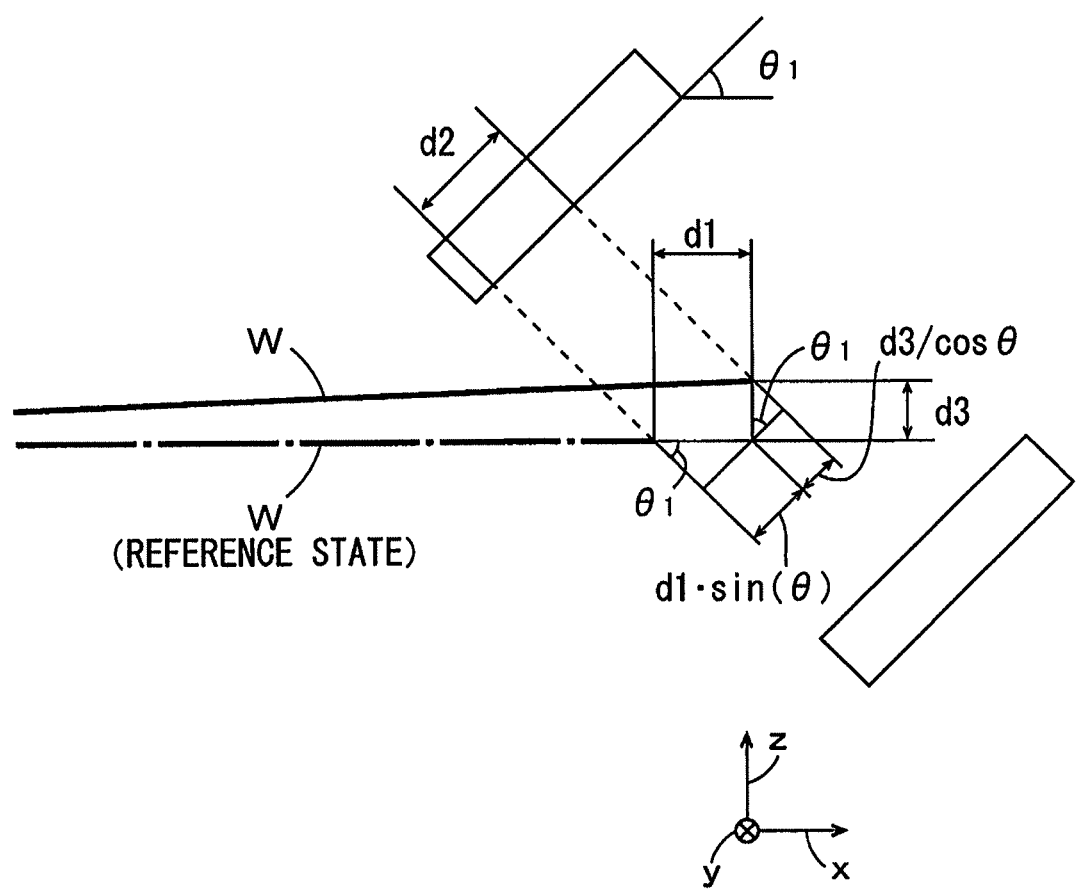
FIGS. 7 and 8 are diagrams for explaining calculation of an arrival deviation amount.
Figure 8:
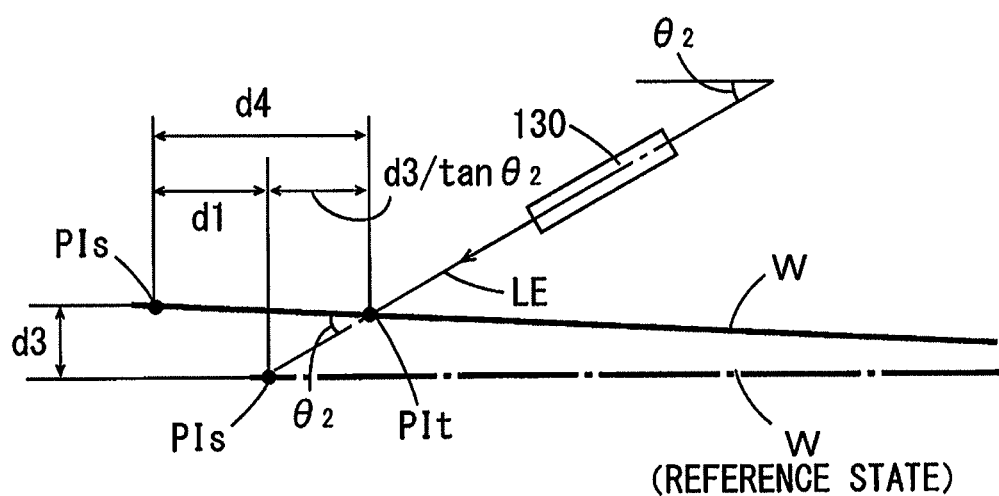

FIGS. 7 and 8 are diagrams for explaining the calculation of an arrival deviation amount. FIG. 7 schematically shows part of the substrate W, and the emitter 152a and the light receiver 152b of the inclination detector 152 along the detection plane PL of FIG. 4. In FIG. 7, the actual substrate W is indicated by a solid line, and the substrate W in the reference state is indicated by a one-dot and dash line. In the example of FIG. 7, an X deviation amount of the substrate W is d1, and an inclination deviation amount of the substrate W is d2. As described above, the X deviation amount d1 is acquired from a result of detection of the vertical detector 151 of FIG. 5, and the inclination deviation amount d2 is acquired from a result of detection of the inclination detector 152 of FIG. 6.

Further, when the substrate W is inclined with respect to the horizontal plane, the position of the outer peripheral end of the substrate W in the Z direction deviates from the position of the substrate W in the reference state. Hereinafter, a position deviation amount between the outer peripheral end of the actual substrate W and the outer peripheral end of the substrate W in the reference state in the Z direction is referred to as a Z deviation amount. In the example of FIG. 7, the Z deviation amount on the detection plane PL is d3.

A relationship among the X deviation amount d1, the inclination deviation amount d2 and the Z deviation amount d3 is expressed by a following formula (1).

$$d2 = d1 \cdot \sin\theta_1 + d3/\cos\theta_1 \quad (1)$$

In the formula (1), $\theta_1$ is the detection inclination angle and known. Therefore, the Z deviation amount d3 can be calculated by the formula (1) with use of the X deviation amount d1 acquired from the result of detection of the vertical detector 151 and the inclination deviation amount d2 acquired from the result of detection of the inclination detector 152.

In FIG. 8, part of the substrate W and the removal nozzle 130 along the nozzle plane PLn of FIG. 4 are schematically shown. Similarly to FIG. 7, the actual substrate W is indicated by a solid line, and the substrate W in the reference state is indicated by a one-dot and dash line. The part of the substrate W shown in FIG. 8 is the same as the part of the substrate W shown in FIG. 7. That is, FIG. 8 shows the state of the substrate W acquired in the case where the rotation shaft 112 is rotated by the angle between the detection plane PL and the nozzle plane PLn of FIG. 4 with the substrate W in the state shown in FIG. 7.

FIG. 8 shows a process line LE indicating directivity of processing by the removal nozzle 130. A path of the removal liquid discharged from the removal nozzle 130 coincides with the process line LE. The process line LE is located on the nozzle plane PLn of FIG. 4. An intersection position PIt of the process line LE with the obverse surface of the actual substrate W corresponds to the actual arrival position, and an intersection position PIs of the process line LE and the obverse surface of the substrate W in the reference state corresponds to the reference arrival position. The distance d4 between the reference arrival position PIs and the actual arrival position PIt in the actual substrate W corresponds to the arrival deviation amount. The arrival deviation amount d4 is expressed by a following formula (2).

$$d4 = d1 + d3/\tan\theta_2 \quad (2)$$

In the formula (2), $\theta_2$ is the inclination angle of the process line LE with respect to the horizontal plane (hereinafter referred to as a nozzle angle) and known. In the present example, the inclination angle of the actual substrate W is significantly small. Thus, it is considered in the present example that the position (height) of the reference arrival position PIs in the Z direction in the actual substrate W and the position (height) of the actual arrival position PIt in the Z direction in the actual substrate W are the same.

It is possible to calculate the arrival deviation amount d4 by the formula (2) using the X deviation amount d1 acquired from the result of detection by the vertical detector 151, the inclination deviation amount d2 acquired from the result of detection by the inclination detector 152 and the Z deviation amount d3 acquired from the above formula (1). In the present example, when the actual arrival position PIt is located at a position farther outward than the reference arrival position PIs, the arrival deviation amount d4 is a positive value. When the actual arrival position PIt is located at a position farther inward than the reference arrival position PIs, the arrival deviation amount d4 is a negative value.

Such arrival deviation amounts are sequentially calculated while the substrate W is rotated. Specifically, every time the substrate W is rotated by a predetermined angle (1°, for example), detection is carried out by the vertical detector 151 and the inclination detector 152 on the detection plane PL, and the X deviation amounts and the inclination deviation amounts of a plurality of portions (hereinafter referred to as detection portions) in the outer periphery of the substrate W are acquired. The Z deviation amounts of the plurality of detection portions are calculated based on the acquired X deviation amounts and the acquired inclination deviation amounts. In the present example, the Z deviation amounts of the plurality of detection portions correspond to the inclination identifying information. The arrival deviation amounts corresponding to the plurality of detection portions are calculated based on the calculated Z deviation amounts of the plurality of detection portions and the nozzle angle. The plurality of detection portions are arranged at certain angular intervals in the outer periphery of the substrate W. Therefore, in the entire circumference of the substrate W, the arrival deviation amounts are calculated at the certain angular intervals.

[5] X Correction Amount and Y Correction Amount

An X correction amount and a Y correction amount of the substrate W are calculated based on the calculated arrival deviation amounts in the entire circumference of the substrate W. The X correction amount is a distance by which the substrate W is to be moved in the X direction from a predetermined initial position, and the Y correction amount is a distance by which the substrate W is to be moved in the Y direction from the predetermined initial position. The initial position is a position of the substrate W when the rotation angle of the rotation shaft 112 is the reference angle (0°), for example.

Figure 9:
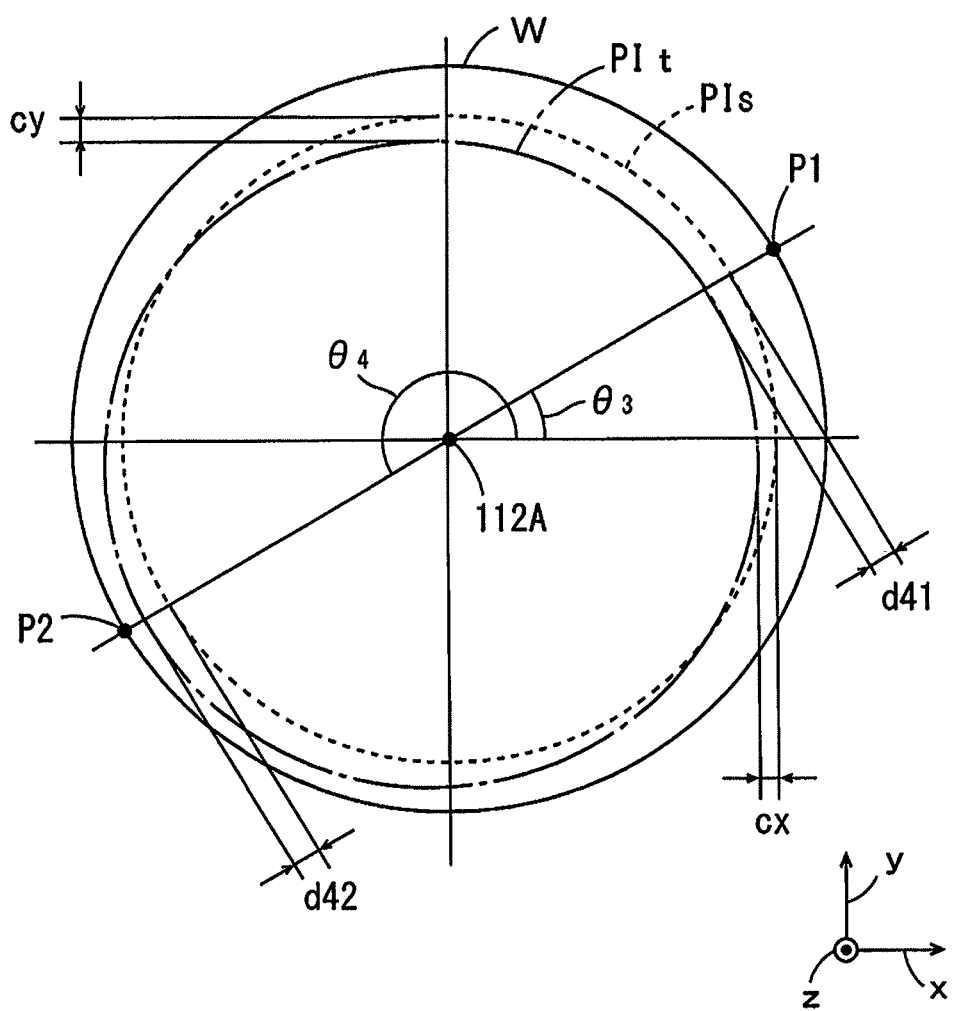
FIG. 9 is a schematic plan view for explaining calculation of an X correction amount and a Y correction amount.

FIG. 9 is a schematic plan view for explaining the calculation of the X correction amount and the Y correction amount. In FIG. 9, the actual arrival position PIt is indicated by a one-dot and dash line, and the reference arrival position PIs is indicated by a broken line. Further, two detection portions P1, P2 out of the plurality of detection portions are shown. The detection portions P1, P2 are located at point symmetrical positions with respect to the axial center 112A of the rotation shaft 112. That is, the rotation angle of the rotation shaft 112 at the detection time point of the detection portion P1 is different from the rotation angle of the rotation shaft 112 at the detection time point of the detection portion P2 by 180 degrees. The arrival deviation amount calculated from the X deviation amount and the inclination deviation amount of the detection portion P1 is d41, and the arrival deviation amount calculated from the X deviation amount and the inclination deviation amount of the detection portion P2 is d42.

The substrate W shown in FIG. 9 is located in the initial position. Therefore, in the state of FIG. 9, the rotation angle of the rotation shaft 112 is 0°. The rotation angle of the rotation shaft 112 at the detection time point of the detection portion P1 is $\theta_3$, and the rotation angle of the rotation shaft 112 at the detection time point of the detection portion P2 is $\theta_4$.

An X correction component value Xps is calculated as a value for calculating the X correction amount by the following formula (3) with use of the arrival position deviation amounts d41, d42 and the angle $\theta_3$. Further, a Y correction component value Yps is calculated as a value for calculating the Y correction amount by the following formula (4) with use of the arrival position deviation amounts d41, d42 and the angle $\theta_3$.

$$Xps=\cos\theta_3 \cdot (d41-d42) \quad (3)$$

$$Yps=\sin\theta_3 \cdot (d41-d42) \quad (4)$$

Alternatively, the X correction component value Xps and the Y correction component value Yps may be calculated by the following formula (3)' and the following formula (4)' with use of the arrival position deviation amounts d41, d42 and the angle $\theta_4$.

$$Xps=\cos\theta_4 \cdot (d12-d11) \quad (3)'$$

$$Yps=\sin\theta_4 \cdot (d12-d11) \quad (4)'$$

The X correction component value Xps obtained by the formula (3) and the X correction component value Xps obtained by the formula (3)' are equal to each other, and the Y correction component value Yps obtained by the formula (4) and the Y correction component value Yps obtained by the formula (4)' are equal to each other.

In this manner, one set of an X correction component value and a Y correction component value are calculated for a pair of detection portions located at point symmetrical positions. Similarly, X correction component values and Y correction component values are calculated for all other pairs of detection portions that are located at point symmetrical positions. For example, in the case where detection portions are present on the outer periphery of the substrate W at intervals of 1°, 180 pairs of an X correction component value and a Y correction component value corresponding to 180 pairs of detection portions are calculated.

An average value of all of the calculated X correction component values is calculated as an X correction amount cx. Further, an average amount of all of the calculated Y correction component values is calculated as a Y correction amount cy. As shown in FIG. 9, in the substrate W located in the initial position, the position deviation amount between the reference arrival position PIs and the actual arrival position PIt in the X direction corresponds to the X correction amount cx, and the position deviation amount between the reference arrival position PIs and the actual arrival position PIt in the Y direction corresponds to the Y correction amount cy.

[6] Position Correction

The substrate movement mechanism 140 moves the substrate W based on the calculated X correction amount cx and the calculated Y correction amount cy such that the actual arrival position PIt and the reference arrival position PIs coincide with each other. Thus, a holding position of the substrate W to be held by the substrate holder 113 of FIG. 1 is corrected. As described above, the substrate movement mechanism 140 moves the substrate W in the X direction. Therefore, in the present example, the rotation angle of the rotation shaft 112 is adjusted such that the actual arrival position PIt and the reference arrival position PIs coincide with each other by the movement only in the X direction.

FIGS. 10 to 14 are schematic plan views and schematic side views for explaining the position correction of the substrate W. First, an angle $\theta t$ and a distance dT are calculated by a following formula (5) and a following formula (6) with use of the calculated X correction amount cx and the calculated Y correction amount cy.

$$\theta t=\arctan(cy/cx) \quad (5)$$

$$dT=\sqrt{(cx^2+cy^2)}\text{tm} \quad (6)$$

Figure 10:
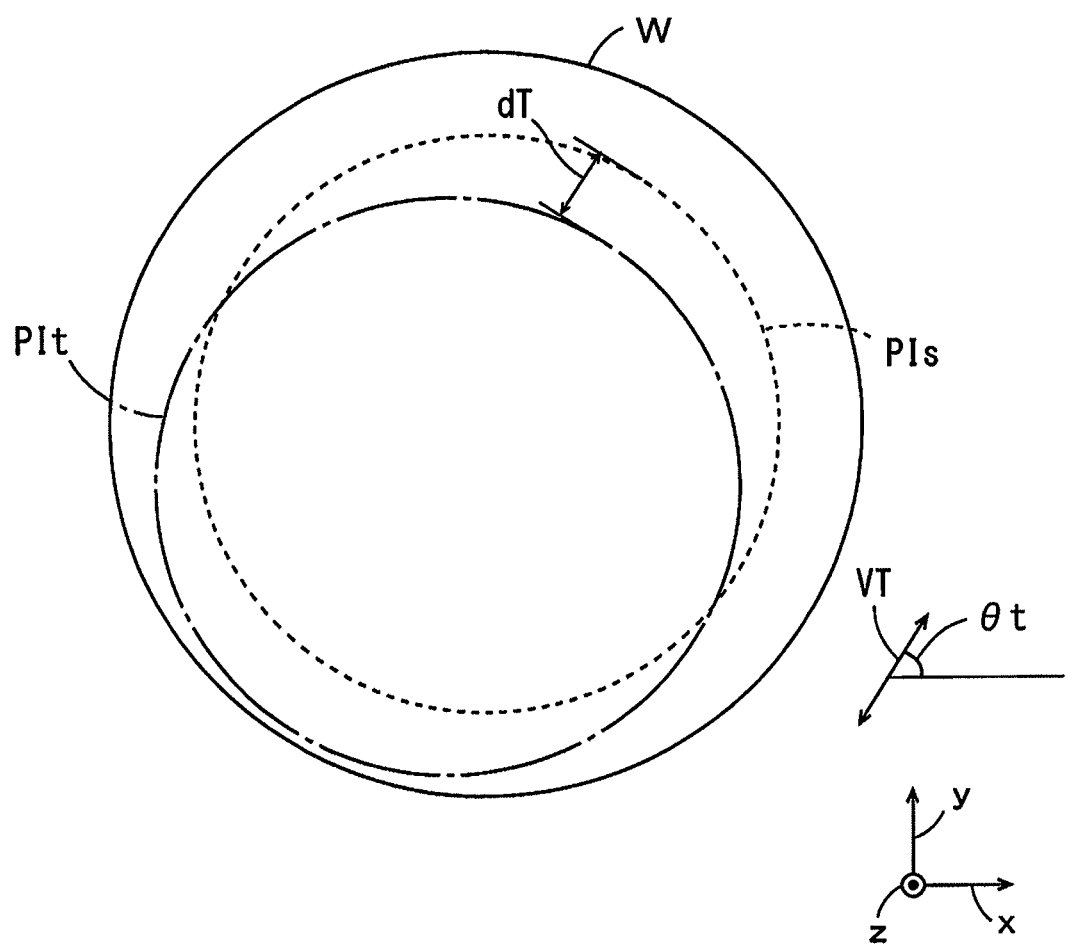
FIGS. 10, 11, 12, 13 and 14 are schematic plan views and schematic side views for explaining position correction of the substrate.

In FIG. 10, the substrate W is in the initial position. In this case, the angle $\theta t$ is equivalent to an angle formed by a direction VT of the deviation between the actual arrival position PIt and the reference arrival position PIs with the X direction. The direction VT is in parallel to a straight line passing through the center of the actual arrival position PIt and the center of the reference arrival position PIs. The distance dT is equivalent to an amount of deviation between the actual arrival position PIt and the reference arrival position PIs in the direction VT. The direction VT and the distance dT are expressed by a vector that includes the X correction amount cx and the Y correction amount cy as a component in the X direction and a component in the Y direction, respectively.

Figure 11:
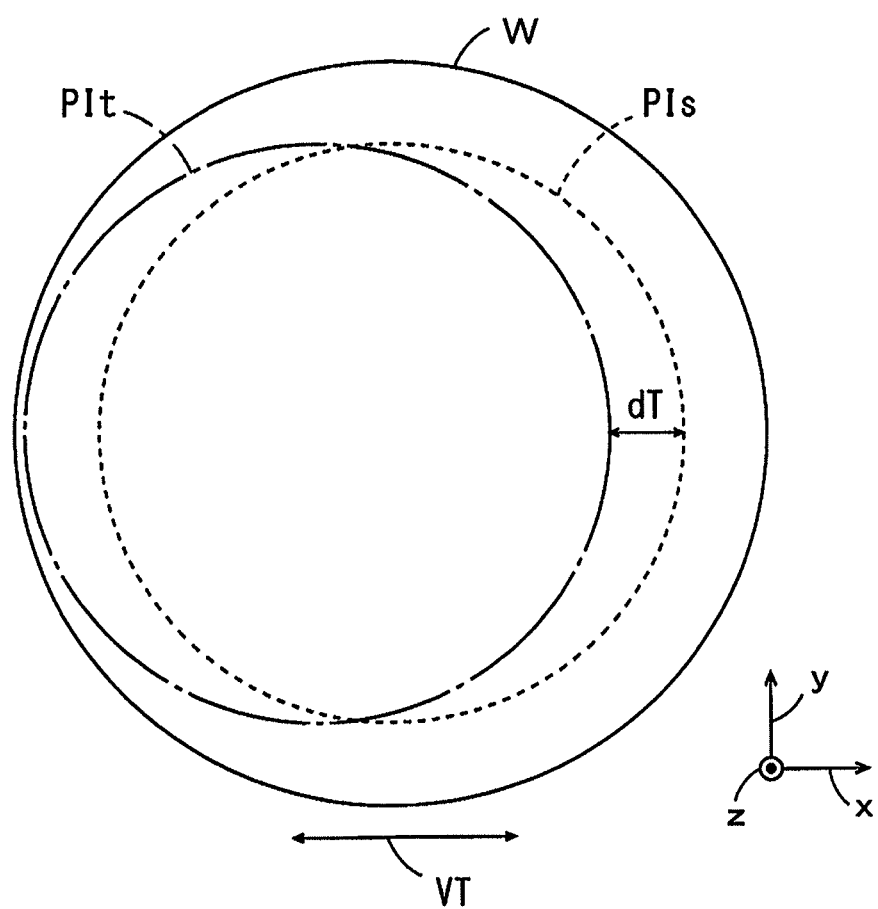

Next, with the substrate W held by suction by the substrate holder 113 of FIG. 1, the rotation angle of the rotation shaft 112 is adjusted to an angle obtained by multiplying the calculated angle θt by −1. For example, the rotation shaft 112 is rotated by −θt with the substrate W in the initial position (the state of FIG. 10). Thus, as shown in FIG. 11, the direction VT is in parallel to the X direction.

Figure 12:
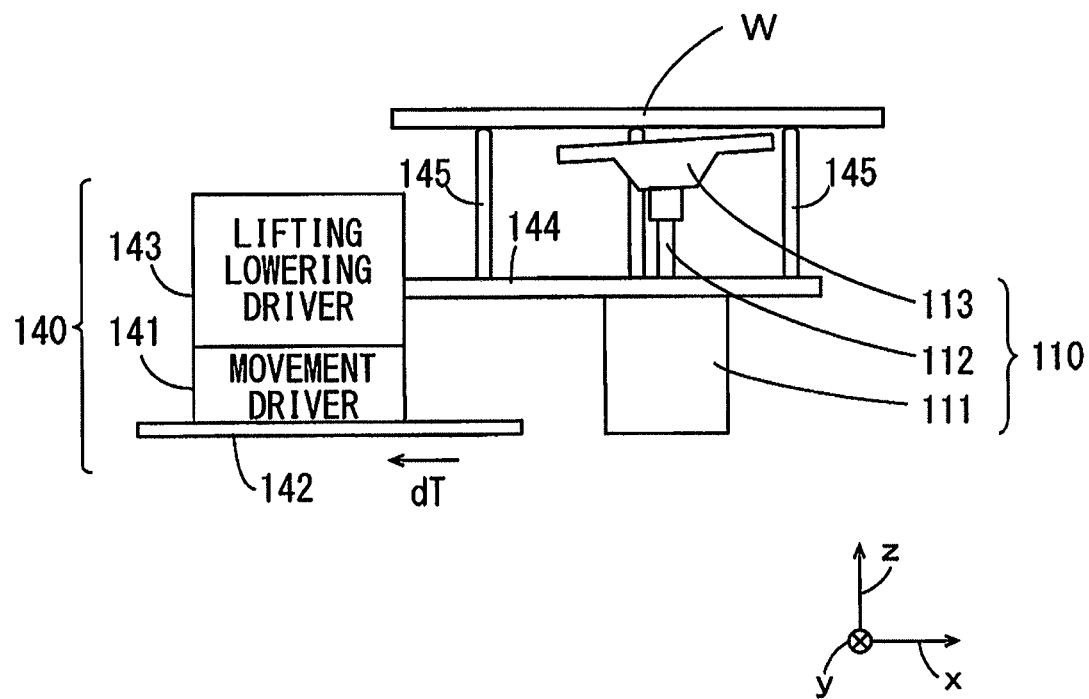
Figure 13:
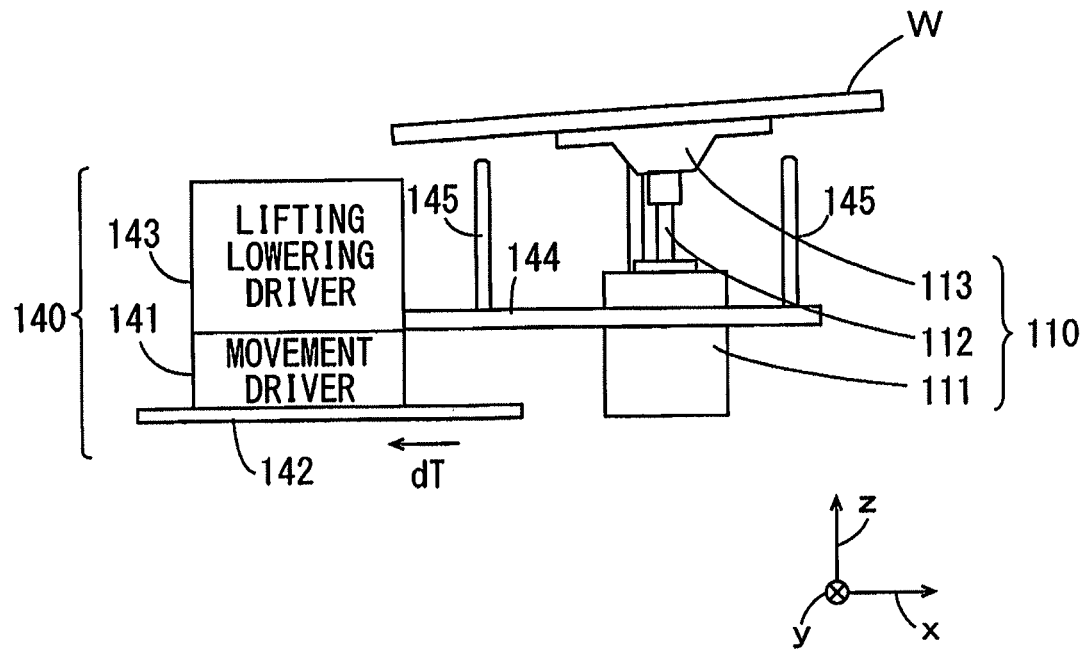
Figure 14:
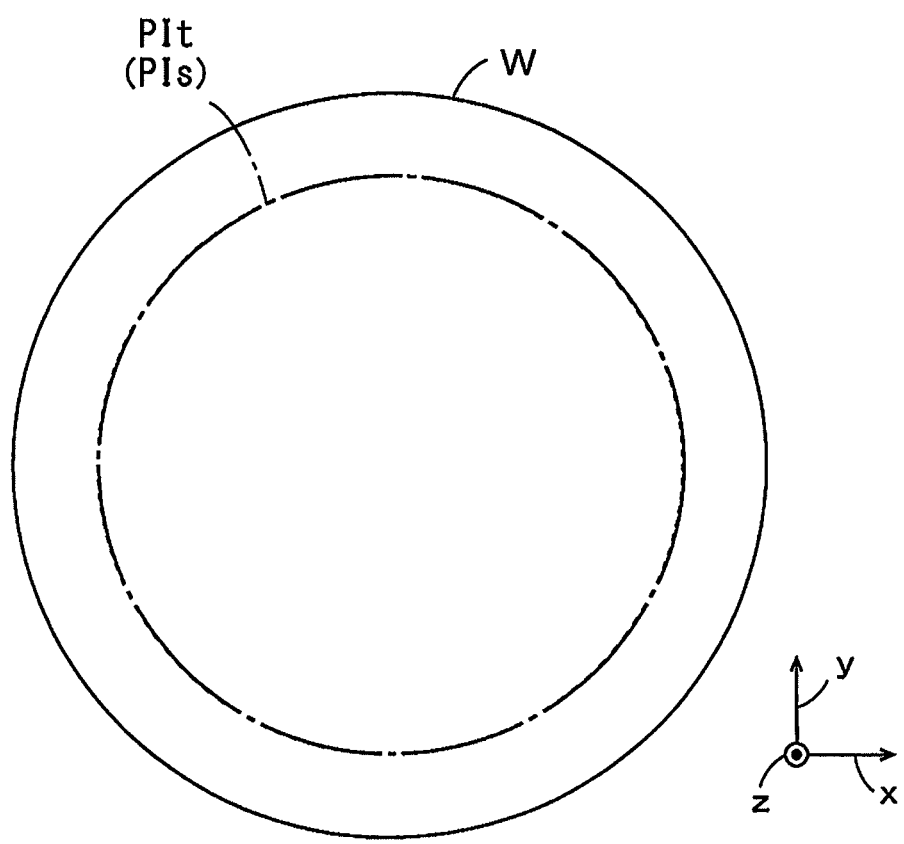

Then, as shown in FIG. 12, the substrate holder 113 is switched to the support state, and the support pins 145 are lifted to the upper positions by the lifting lowering driver 143. In this state, the substrate W is moved by the movement driver 141 in the X direction by the calculated distance dT. Thereafter, as shown in FIG. 13, the support pins 145 are returned to the lower positions, and the substrate holder 113 is switched to the suction state. Thus, as shown in FIG. 14, with the substrate W maintained inclined, the actual arrival position PIt and the reference arrival position PIs coincide with each other.

Thereafter, the peripheral region removal processing of the substrate W is performed similarly to the example of FIG. 2. Thus, the removal liquid from the removal nozzle 130 arrives at the reference arrival position PIs in the entire circumference of the substrate W. Therefore, the width of the peripheral region of the substrate W processed by the removal liquid is uniform in the entire circumference of the substrate W. Therefore, the film portion on the peripheral region of the substrate W can be appropriately removed.

[7] Functional Configuration of Peripheral Processing Controller

Figure 15:
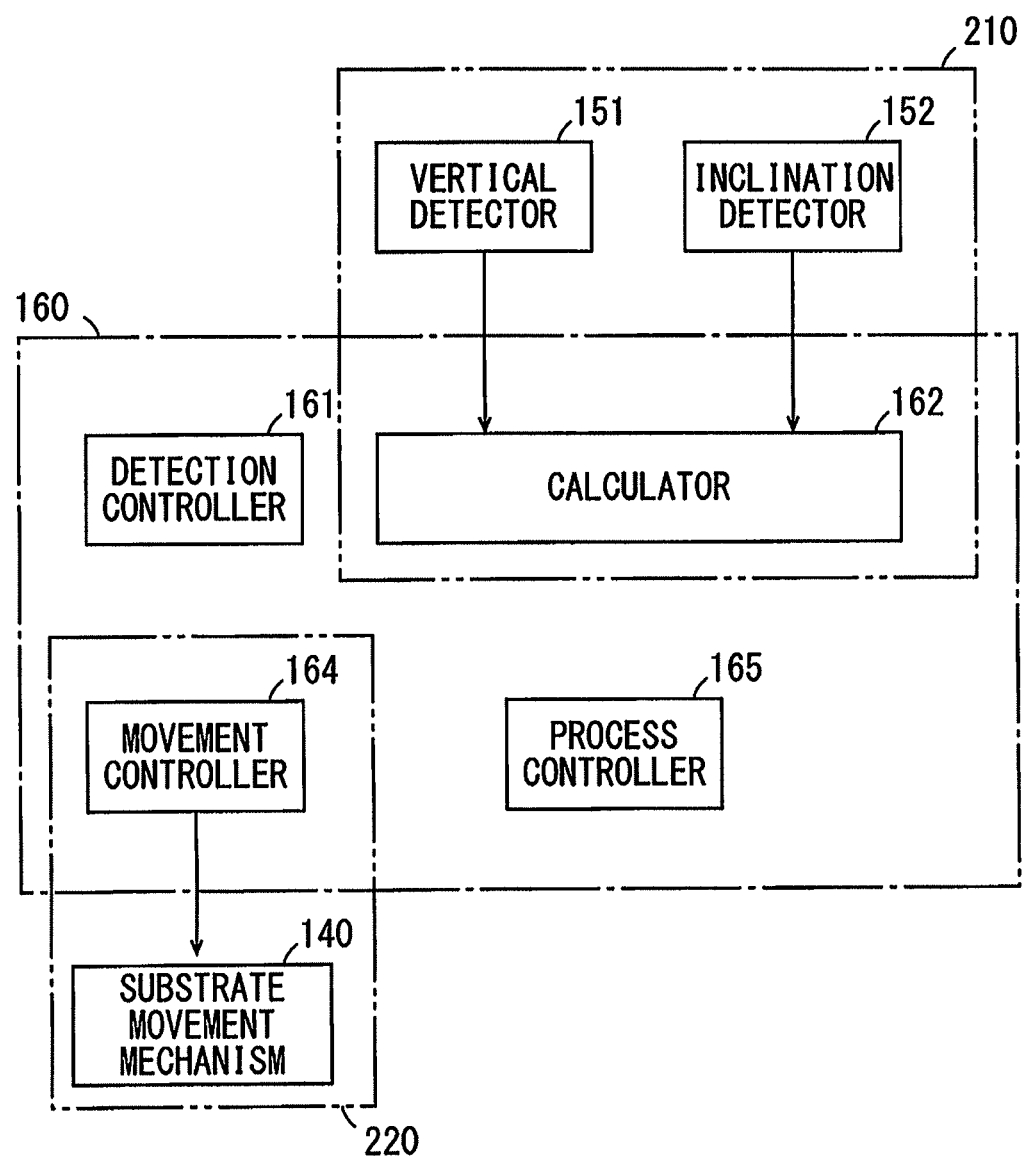
FIG. 15 is a block diagram showing a functional configuration of a peripheral processing controller.

FIG. 15 is a block diagram showing a functional configuration of the peripheral processing controller 160. As shown in FIG. 15, the peripheral processing controller 160 includes a detection controller 161, a calculator 162, a movement controller 164 and a process controller 165. These functions are implemented when the CPU executes a computer program stored in a storage medium such as the ROM or the storage device.

The detection controller 161 controls the substrate rotation mechanism 110 and the outer peripheral end detector 150 of FIG. 1 to control the operation of detecting the outer peripheral end of the substrate W. The calculator 162 calculates positions of the plurality of detection portions in the Z direction based on the results of detection by the vertical detector 151 and the inclination detector 152 of the outer peripheral end detector 150. An information detector 210 is constituted by the calculator 162, the vertical detector 151 and the inclination detector 152. The movement controller 164 controls the substrate movement mechanism 140 to correct the position of the substrate W. The position corrector 220 is constituted by the movement controller 164 and the substrate movement mechanism 140. The process controller 165 controls the substrate rotation mechanism 110 and the valve VL of FIG. 1 to control the peripheral processing of the substrate W.

[8] Operation of Peripheral Processing Apparatus

Figure 16:
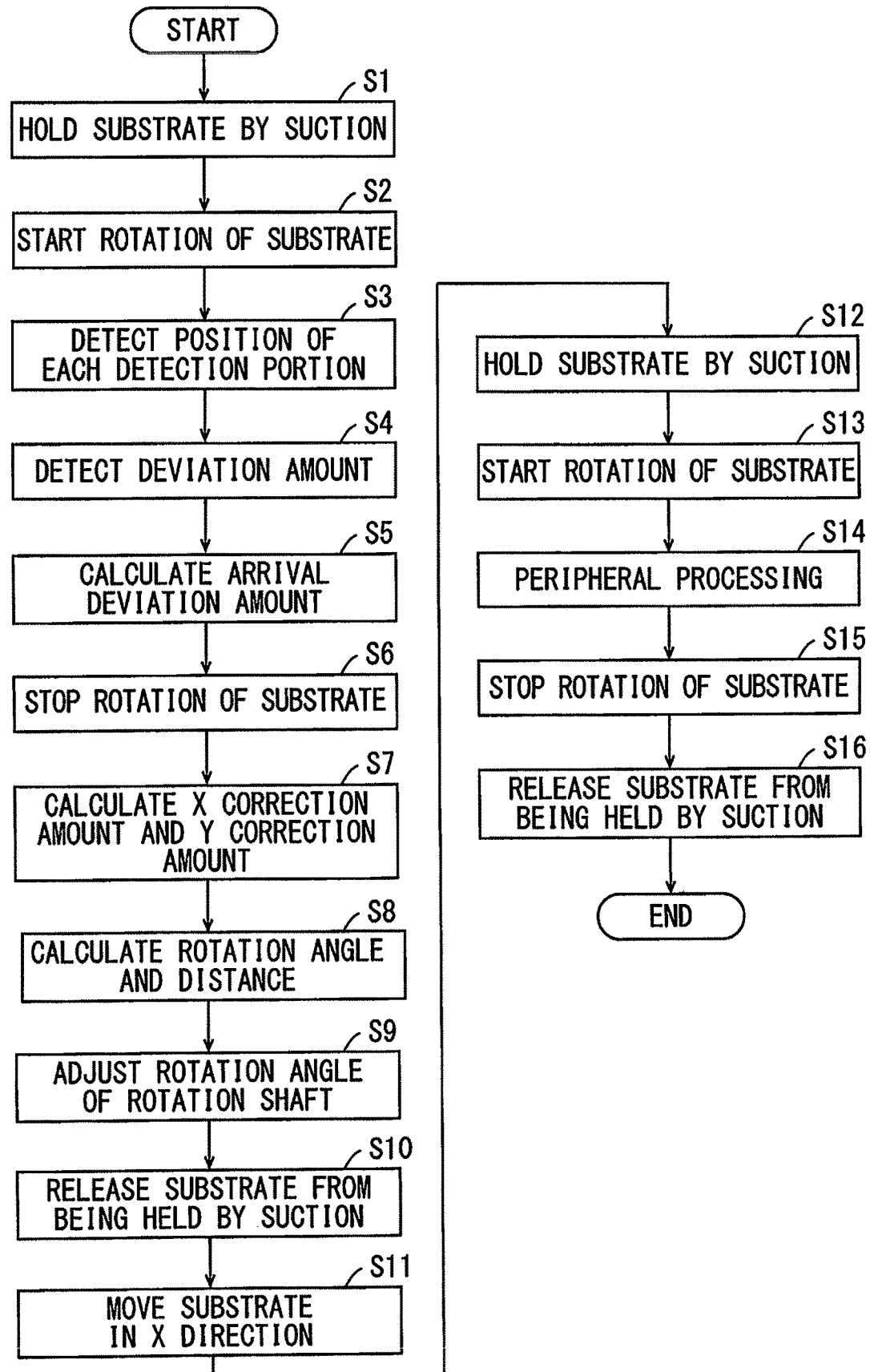
FIG. 16 is a flow chart showing an operation of the peripheral processing apparatus.

FIG. 16 is a flow chart showing the operation of the peripheral processing apparatus 100. The substrate W that has been carried into the peripheral processing apparatus 100 is placed on the substrate holder 113. In the present example, at the time of start of an operation of the peripheral processing apparatus 100, the substrate holder 113 is in the support state, and the rotation angle of the rotation shaft 112 is the reference angle (0°).

First, the detection controller 161 switches the substrate holder 113 to the suction state so as to hold the substrate W by suction (step S1). Next, the detection controller 161 starts the rotation of the substrate W by the rotation driver 111 (step S2). Then, the detection controller 161 detects positions in the outer peripheral end (the detection portions) of the substrate W in the X direction and the inclination detection direction by the vertical detector 151 and the inclination detector 152 every time the substrate W is rotated by a predetermined angle (step S3). Then, the calculator 162 acquires the X deviation amount and the inclination deviation amount of each detection portion based on the acquired positions, and calculates the Z deviation amount of each detection portion based on the acquired X deviation amount and the acquired inclination deviation amount (step S4). Then, the calculator 162 calculates the arrival deviation amount corresponding to each detection portion based on each acquired and calculated deviation amount (step S5). When the substrate W is rotated by 360 degrees, the positions of all of the detection portions are detected. Therefore, the detection controller 161 stops the rotation of the substrate W by the rotation driver 111 (step S6).

Next, the movement controller 164 calculates the X correction amount and the Y correction amount based on the arrival deviation amount corresponding to each detection portion calculated in the step S5 (step S7). Then, based on the calculated X correction amount and the calculated Y correction amount, the movement controller 164 calculates the rotation angle of the rotation shaft 112 for allowing the direction of deviation between actual the arrival position PIt and the reference arrival position PIs to coincide with the X direction, and calculates a distance by which the substrate W is to be moved (step S8). Next, the movement controller 164 adjusts the rotation angle of the rotation shaft 112 by the rotation driver 111 to coincide with the calculated rotation angle (step S9). Further, the movement controller 164 switches the substrate holder 113 to the support state to release the substrate W from being held by suction (step S10).

Then, the movement controller 164 moves the substrate W in the X direction by the calculated distance using the substrate movement mechanism 140 (step S11). Next, the process controller 165 switches the substrate holder 133 to the suction state to hold the substrate W by suction (step S12), and starts the rotation of the substrate W by the rotation driver 111 (step S13). In this state, the process controller 165 opens the valve VL to discharge the removal liquid from the removal nozzle 130 and performs peripheral processing of the substrate W (step S14). In this case, the removal liquid supplied from the removal nozzle 130 arrives at the reference arrival position PIs in the entire circumference of the substrate W, so that the width of the peripheral region of the substrate W that is processed by the removal liquid is uniform in the entire circumference of the substrate W. When the peripheral processing ends, the process controller 165 closes the valve VL of FIG. 1 and stops the rotation of the substrate W by the rotation driver 111 (step S15). Then, the process controller 165 switches the substrate holder 113 to the support state to release the substrate W from being held by suction (step S16). Thereafter, the substrate W that has been processed is carried out from the peripheral processing apparatus 100.

[9] Effects of Embodiment

In the peripheral processing apparatus 100 according to the present embodiment, the inclination identifying information for identifying the inclination of the substrate W with respect to the horizontal plane is detected, and the holding position of the substrate W held by the substrate holder 113 is corrected in the horizontal direction based on the detected inclination identifying information and the predetermined nozzle angle such that the distance between a portion of the substrate W to be processed by the removal nozzle 130 and the center of the substrate W is maintained constant. In this state, the removal liquid is supplied to the peripheral region of the substrate W by the removal nozzle 130 while the substrate W is rotated by the rotation driver 111. In this case, a portion located at the position spaced apart from the center of the substrate W by the constant distance in the entire circumference of the substrate W can be processed while the substrate W is maintained inclined. Therefore, it is possible to perform processing appropriately on the peripheral region of the substrate W while inhibiting complication of the configuration and the operation of the apparatus.

Further, in the present embodiment, the X deviation amounts and the inclination deviation amounts of the plurality of detection portions are acquired by the vertical detector 151 and the inclination detector 152, and the Z deviation amounts of the plurality of detection portions are calculated based on the acquired X deviation amounts and the acquired inclination deviation amounts as the inclination identifying information. Thus, it is possible to acquire the Z deviation amounts of the plurality of detection portions while inhibiting the complication of the configuration and operation of the apparatus.

Further, in the present embodiment, the rotation angle of the rotation shaft 112 is adjusted such that a direction in which the substrate W is to be moved coincides with the X direction, and then the substrate W is moved by the substrate movement mechanism 140 in the X direction, so that the holding position of the substrate W is corrected. Thus, it is possible to simplify the configuration of the substrate movement mechanism 140 and correct the position of the substrate W without increasing the cost of the apparatus.

[10] Other Embodiments

While the vertical detector 151 and the inclination detector 152 are integrally provided in the above mentioned embodiment, the vertical detector 151 and the inclination detector 152 may be provided at positions spaced apart from each other in the circumferential direction of the substrate W. In this case, as for one detection portion, the rotation angle of the rotation shaft 112 when the vertical detector 151 detects the one detection portion, and the rotation angle of the rotation shaft 112 when the inclination detector 152 detects the one detection portion are different from each other. Therefore, as for the one detection portion, a result of detection by the vertical detector 151 and a result of detection by the inclination detector 152 are associated with each other based on the angular interval between the vertical detector 151 and the inclination detector 152.

While the positions in the outer peripheral end of the substrate W in the Z direction are detected by the two line sensors respectively included in the vertical detector 151 and the inclination detector 152 in the above mentioned embodi-ment, other types of sensors may be used. For example, a displacement sensor that detects displacement of the outer peripheral end of the substrate W may be used by triangulation, for example. In this case, the position (displacement) of the outer peripheral end of the substrate W in the Z direction may be detected by one displacement sensor.

While the substrate movement mechanism 140 that can move the substrate W only in the X direction on the horizontal plane is used in the above mentioned embodiment, a movement mechanism that can move the substrate W in a plurality of directions (the X direction and the Y direction, for example) on the horizontal plane may be used. In that case, when the position of the substrate W is corrected, it is possible to move the substrate W to a desired position without adjusting the rotation angle of the rotation shaft 112 in order to allow the movement direction of the substrate W to coincide with the X direction.

While the peripheral region removal processing of removing the film portion formed on the peripheral region of the substrate W is performed as the peripheral processing of the substrate W in the above mentioned embodiment, another peripheral processing may be performed. For example, an emitter that emits light to the peripheral region of the substrate W may be provided as the peripheral region processor. Alternatively, edge exposure processing that exposes the peripheral region of the substrate W may be performed.

Further, as the peripheral region removal processing of removing the film portion formed on the peripheral region of the substrate W, bevel etching processing of removing an Al (Aluminum) film or a TiN (Titanium Nitride) film remaining on the peripheral region of the substrate W using an etching liquid (SC1 (Ammonium Hydrogen Peroxide Solution), for example) after the film formation processing can be employed.

[11] Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the above mentioned embodiment, the peripheral processing apparatus 100 is an example of a peripheral processing apparatus, the substrate rotation mechanism 110 is an example of a rotation holder, the removal nozzle 130 is an example of a peripheral region processor and a nozzle, the Z direction is an example of a first direction, the nozzle angle is an example of a first angle, the information detector 210 is an example of an information detector, the position corrector 220 is an example of a position corrector, the inclination detector 152 is an example of a first detector, the inclination detection direction is an example of a second direction, the vertical detector 151 is an example of a second detector, the X direction is an example of third and fourth direction, the calculator 162 is an example of a calculator, the support members 154, 155 are an example of a holder, the substrate movement mechanism 140 is an example of a movement mechanism, and the movement controller 164 is an example of a movement controller.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A peripheral processing apparatus that performs processing on an annular peripheral region in one surface of a substrate, the peripheral region extending along an outer periphery of the substrate, the outer periphery being at least partially circular, comprising:
   a rotation holder that holds the substrate and rotates the substrate about a rotation axis that is parallel to a first direction being a vertical direction;
   a peripheral region processor that performs the processing on the peripheral region of the held substrate, the processing including discharging liquid or emitting light to the peripheral region in an oblique direction inclined by a first angle smaller than 90 degrees with respect to a horizontal reference plane orthogonal to the first direction in a vertical plane parallel to the first direction;
   an information detector that detects information for identifying the inclination of the held substrate with respect to the horizontal reference plane as inclination identifying information, the inclination of the held substrate being inclination with respect to the horizontal reference plane in a vertical plane parallel to the first direction; and
   a position corrector that corrects a holding position of the substrate held by the rotation holder in a direction that is parallel to the horizontal reference plane based on the inclination identifying information detected by the information detector and the first angle such that a distance between a portion of the substrate that is to be processed by the peripheral region processor and a center of the substrate is maintained constant when the substrate is rotated by the rotation holder,
   wherein the inclination identifying information includes heights of a plurality of detection portions of the peripheral region of the held substrate,
   wherein the information detector includes,
   a vertical detector that detects a position of an outer peripheral end of the substrate in a horizontal direction,
   an inclination detector that detects a position of the outer peripheral end of the substrate in a direction inclined with respect to the horizontal direction, and
   a calculator that calculates the heights of the plurality of detection portions based on detection results of the vertical detector and the inclination detector, and
   wherein the position corrector includes,
   a substrate mover that is connected to the rotation holder and moves the rotation holder in the horizontal direction, and
   a movement controller that controls the substrate mover such that the distance between the portion of the substrate that is to be processed by the peripheral region processor and the center of the substrate is maintained constant when the substrate is rotated by the rotation holder.

2. The peripheral processing apparatus according to claim 1, wherein
   the vertical detector includes a first line sensor,
   the inclination detector includes a second line sensor,
   the first line sensor has a first light receiving surface that is parallel to the horizontal reference plane, and
   the second line sensor has a second light receiving surface that is inclined with respect to the horizontal reference plane.

3. The peripheral processing apparatus according to claim 1, further comprising a holder that integrally holds the vertical detector and the inclination detector, wherein
   first positions of the plurality of detection portions are sequentially detected by the vertical detector when the substrate is rotated by the rotation holder, and
   second positions of the plurality of detection portions are sequentially detected by the inclination detector when the substrate is rotated by the rotation holder.

4. The peripheral processing apparatus according to claim 1, wherein
   the substrate mover is provided to be contactable with the substrate and is configured to move the substrate with respect to the rotation holder, and
   the movement controller is configured to control the substrate mover based on the detected inclination identifying information and the first angle.

5. The peripheral processing apparatus according to claim 4, wherein
   the substrate mover is configured to move the substrate in a fourth direction that is parallel to the horizontal reference plane, and
   the movement controller controls the rotation holder based on the detected inclination identifying information and the first angle such that a correction direction of the holding position coincides with the fourth direction by rotation of the substrate, and controls the substrate mover such that the substrate moves in the fourth direction after rotation of the substrate.

6. The peripheral processing apparatus according to claim 1, wherein
   the peripheral region processor includes a nozzle that discharges a processing liquid in a direction that is inclined with respect to the reference plane by the first angle.

7. A peripheral processing apparatus that performs processing on an annular peripheral region in one surface of a substrate, the peripheral region extending along an outer periphery of the substrate, the outer periphery being at least partially circular, comprising:
   a rotation holder that holds the substrate and rotates the substrate about a rotation axis extending in a vertical direction, the substrate being inclined with respect to a horizontal plane;
   a nozzle that discharges liquid to the peripheral region of the substrate rotated by the rotation holder in an oblique direction inclined in a vertical plane by a first angle smaller than 90 degrees with respect to the horizontal plane;
   an information detector that detects information for identifying inclination of the held substrate with respect to the horizontal plane as inclination identifying information; and
   a position corrector that corrects a holding position of the substrate held by the rotation holder in a direction that is parallel to the horizontal plane based on the inclination identifying information detected by the information detector and the first angle such that a distance between a portion of the substrate that is to be processed by the peripheral region processor and a center of the substrate is maintained constant when the substrate is rotated by the rotation holder, wherein the inclination identifying information includes heights of a plurality of detection portions of the peripheral region of the held substrate,
wherein the information detector includes,
a vertical detector that detects a position of an outer peripheral end of the substrate in a horizontal direction,
an inclination detector that detects a position of the outer peripheral end of the substrate in a direction inclined with respect to the horizontal direction, and
a calculator that calculates the heights of the plurality of detection portions based on detection results of the vertical detector and the inclination detector, and
wherein the position corrector includes,
a substrate mover that is connected to the rotation holder and moves the rotation holder in the horizontal direction, and
a movement controller that controls the substrate mover such that the distance between the portion of the substrate that is to be processed by the peripheral region processor and the center of the substrate is maintained constant when the substrate is rotated by the rotation holder.

8. A peripheral processing apparatus that performs processing on an annular peripheral region in one surface of a substrate, the peripheral region extending along an outer periphery of the substrate, the outer periphery being at least partially circular, comprising:
a rotation holder that holds the substrate and rotates the substrate about a rotation axis extending in a vertical direction, the substrate being inclined with respect to a horizontal plane;
an emitter that emits light to the peripheral region of the substrate rotated by the rotation holder in an oblique direction inclined in a vertical plane by a first angle smaller than 90 degrees with respect to the horizontal plane;
an information detector that detects information for identifying inclination of the held substrate with respect to the horizontal plane as inclination identifying information; and
a position corrector that corrects a holding position of the substrate held by the rotation holder in a direction that is parallel to the horizontal plane based on the inclination identifying information detected by the information detector and the first angle such that a distance between a portion of the substrate that is to be processed by the peripheral region processor and a center of the substrate is maintained constant when the substrate is rotated by the rotation holder,
wherein the inclination identifying information includes heights of a plurality of detection portions of the peripheral region of the held substrate,
wherein the information detector includes,
a vertical detector that detects a position of an outer peripheral end of the substrate in a horizontal direction,
an inclination detector that detects a position of the outer peripheral end of the substrate in a direction inclined with respect to the horizontal direction, and
a calculator that calculates the heights of the plurality of detection portions based on detection results of the vertical detector and the inclination detector, and
wherein the position corrector includes,
a substrate mover that is connected to the rotation holder and moves the rotation holder in the horizontal direction, and
a movement controller that controls the substrate mover such that the distance between the portion of the substrate that is to be processed by the peripheral region processor and the center of the substrate is maintained constant when the substrate is rotated by the rotation holder.

* * * * *